US008723507B2

(12) United States Patent
Kirkpatrick et al.

(10) Patent No.: US 8,723,507 B2
(45) Date of Patent: May 13, 2014

(54) METHOD AND APPARATUS FOR PERFORMING IN-PACKAGE SENSOR ADJUSTMENTS

(75) Inventors: Richard Kirkpatrick, Richardson, TX (US); Yousef M. Alimi, Allen, TX (US)

(73) Assignee: Honeywell International Inc., Morristown, NJ (US)

( * ) Notice: Subject to any disclaimer, the term of this patent is extended or adjusted under 35 U.S.C. 154(b) by 199 days.

(21) Appl. No.: 13/449,149

(22) Filed: Apr. 17, 2012

(65) Prior Publication Data
US 2013/0271124 A1      Oct. 17, 2013

(51) Int. Cl.
*G01R 35/00*      (2006.01)

(52) U.S. Cl.
USPC ............ 324/202; 324/225; 324/252; 324/251

(58) Field of Classification Search
USPC .................................. 324/202, 225, 251, 252
See application file for complete search history.

(56) References Cited

U.S. PATENT DOCUMENTS

| | | | |
|---|---|---|---|
| 6,525,531 B2 | 2/2003 | Forrest et al. | |
| 6,532,436 B2 | 3/2003 | Motz | |
| 6,957,173 B2 | 10/2005 | Motz | |
| 7,138,793 B1 | 11/2006 | Bailey | |
| 7,336,068 B2 * | 2/2008 | Muller | 324/202 |
| 7,391,207 B2 * | 6/2008 | Oohira | 324/207.25 |
| 7,923,987 B2 | 4/2011 | Ausserlechner | |

OTHER PUBLICATIONS

"A1190, A1192, and A1193 Programmable, Chopper-Stabilized, Two Wire Hall-Effect Switches." Allegro MicroSystems Inc., Revision 3, 18 pages, 2011. A1190-DS.

"A1210, A1211, A1212, A1213, and A1214 Continuous-Time Launch Family," Allegro MicroSystems Inc., Revision 9, 13 pages, printed 2010. A1210-DS.
"A3250, and A3251 Field-Programmable, Chopper-Stabilized, Unipolar Hall-Effect Switches," Allegro MicroSystems Inc., 15 pages, 2010. Product Discontinued. UA.
Honeywell, "Hall Effect Sensors Chapter 2," Micro Switch Sensing and Control, 3 pages, Printed Jul. 2012.
"A1301 and A1302 Continuous-Time Radiometric Linear Hall Effect Sensor ICs Datasheet," Allegro MicroSystems Inc., Rev. 17, 10 pages, 2010. A1301-DS.
"A1373 and A1374 High Precision, Output Pin Programmable Linear Hall Effect Sensor ICs," Allegro MicroSystems Inc., Rev. 12, 23 pages, 2008. Product Discontinued 2011.
"A1301 and A1302 Continuous-Time Radiometric Linear Hall Effect Sensor ICs," Allegro Microsystems Inc., 2 pages, 2012.

(Continued)

*Primary Examiner* — Jay Patidar
(74) *Attorney, Agent, or Firm* — Seager Tufte & Wickhem LLC

(57) ABSTRACT

An illustrative packaged magnetic field sensor includes a power input terminal and a sensor output terminal, both accessible from outside of the package housing. A sensing block is situated in the package housing and electrically coupled to the magnetic field sensing device and the sensor output terminal. An adjustment block is situated in the package housing and coupled to the power input terminal and the sensing block. In some cases, the adjustment block may receive one or more messages that include sensor adjustment information. The one or more messages may be modulated onto the power input signal. The adjustment block may decode the received sensor adjustment information from the messages, and store the decoded adjustment information into a memory. The adjustment block may then adjust the output signal of the sensing block based on the decoded adjustment information.

23 Claims, 18 Drawing Sheets

(56) References Cited

OTHER PUBLICATIONS

"Application Information Hall-Effect IC Applications Guide," Allegro MicroSystems Inc., Revision 2, 40 pages, 2010. 27701-AN.
Infineon "TLE4998C3C Programmable Linear Hall Sensor Data Sheet," Infineon Technologies AG, Revision 1.1, 42 pages, Sep. 2009. Edition Sep. 2009.
Infineon, "TLE4998S/P User Programming Guide Application Note; Sensors," Infineon Technologies AG, Revision 1.2, 30 pages. Feb. 2009. Edition Feb. 2009.
Gary Pepka, "Application Information Position and Level Sensing Using Hall Effect Sensing Technology," Allegro MicroSystems Inc., 9 pages, Printed 2012. AN295044N.

* cited by examiner

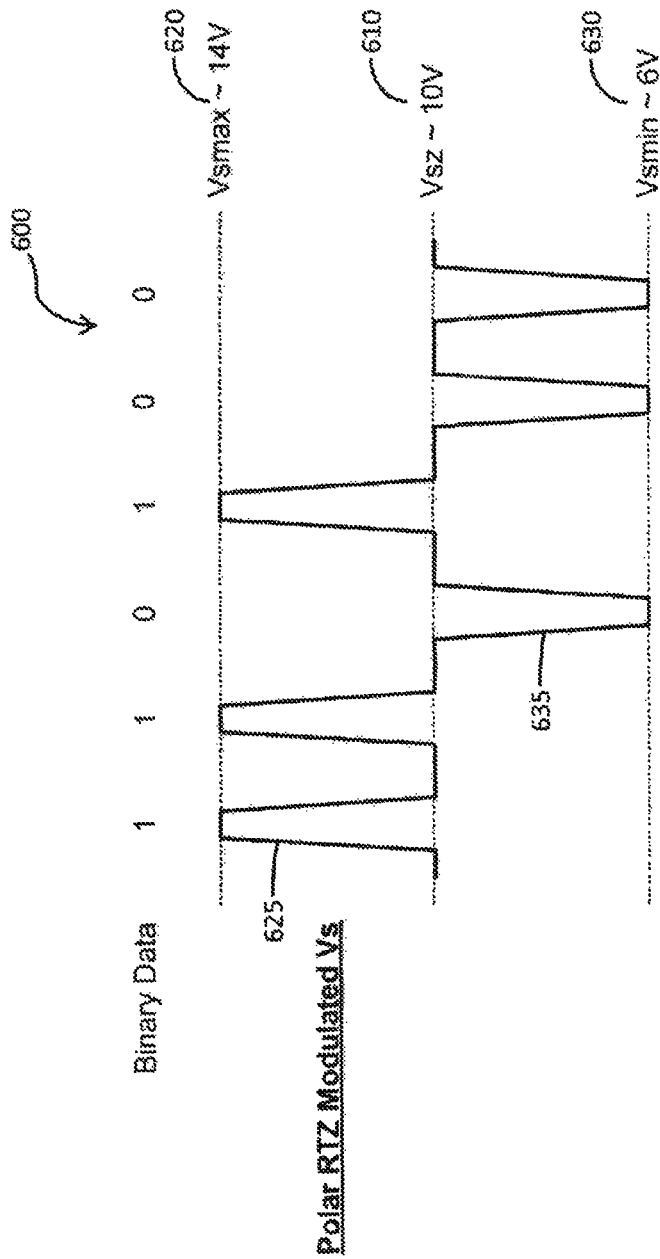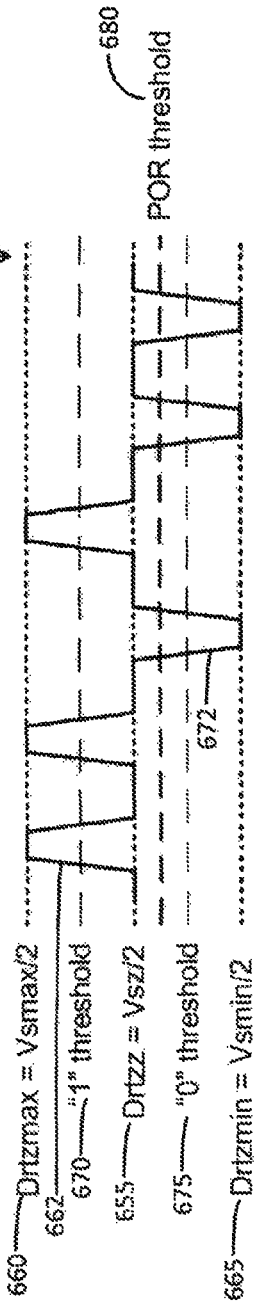
Figure 6A
Figure 6B

METHOD AND APPARATUS FOR PERFORMING IN-PACKAGE SENSOR ADJUSTMENTS

TECHNICAL FIELD

The present disclosure relates generally to sensors, and more particularly, to methods and apparatus for performing in-package sensor adjustments.

BACKGROUND

Sensors typically include a sense element enclosed within a sensor package. The package typically includes one or more electrical terminals or pins that are electrically connected to the sense element. The terminals or pins of the sensor package often include power and signal pins. The package helps protect the sensor element during use. However, once the sense element is packaged (in-package), the sense element is typically not physically accessible from outside of the package. In some instances, however, it may be desirable to adjust, calibrate or otherwise tune or trim the sensor characteristics after it is packaged, sometimes even after the sensor is deployed in the field.

SUMMARY

The present disclosure relates generally to sensors, and more particularly, to methods and apparatus for performing in-package sensor adjustments. In one illustrative embodiment, a packaged magnetic field sensor is configured to receive sensor adjustment messages from an external source. While magnetic field sensors are used as an example, it is contemplated that the present disclosure may be applied to any suitable sensor including pressure, flow, humidity, chemical, temperature, acceleration, or any other suitable sensor or sensor type, as desired.

In some cases, an illustrative packaged magnetic field sensor may include a package housing, with a magnetic field sensing device situated in the package housing for sensing a magnetic field. The package housing may include a power input terminal and a sensor output terminal, both accessible from outside of the package housing. A sensing block may be situated in the package housing and electrically coupled to the magnetic field sensing device and the sensor output terminal. An adjustment block may be situated in the package housing and coupled to the power input terminal and the sensing block. In some cases, the adjustment block may receive one or more messages that include sensor adjustment information. The one or more messages may be modulated onto the power input signal. The adjustment block may be configured to decode the received sensor adjustment information from the messages, and store the decoded adjustment information into a memory. The adjustment block may then adjust the output signal of the sensing block based on the decoded adjustment information. In some cases, the magnetic field sensor may be provided without a package housing or with a package housing substantially similar in size to the magnetic field sensor die, such that the magnetic field sensor may be used for applications using chip scale packaging.

In some instances, the adjustment block may be used to adjust at least two parameters of the output signal based on one or more sensor adjustment messages that are modulated onto the power input terminal of the packaged magnetic field sensor. In some instances, each of the sensor adjustment messages may include a parameter field and a data field, wherein the parameter field may identify one of the at least two parameters of the output signal to adjust, and the data field may identify a measure related to an adjusted value for the identified parameter. The adjustable parameters may include, for example, symmetry, sensitivity, differential, offset, temperature compensation, linearity, polarity, operating point, release point, hysteresis and/or any other suitable parameter of the output signal.

In some cases, the adjustment block may adjust the sensor output signal differently for each of two or more different temperature ranges. A memory may be situated in the package housing and coupled to the adjustment block. The memory may store a first set of adjustment information used for adjusting the sensor output signal over a first temperature range, and may store a second set of adjustment information for adjusting the sensor output signal over a second temperature range.

In some cases, a voltage regulator may be situated in the package housing and coupled to the power input terminal. The voltage regulator may provide a regulated supply voltage from the power input terminal to the magnetic field sensing device, the sensing block and/or the adjustment block during operation of the packaged magnetic field sensor. In some cases, this may allow the packaged magnetic field sensor to provide an output signal that is related to the sensed magnetic field while one or more messages are being modulated onto the power input terminal and communicated to the packaged magnetic field sensor. In some cases, the adjustment information may be transmitted to the packaged magnetic field sensor, and the sensor output signal of the package magnetic field sensor may be adjusted, without taking the packaged magnetic field sensor off-line.

The preceding summary is provided to facilitate an understanding of some of the innovative features unique to the present disclosure and is not intended to be a full description. A full appreciation of the disclosure can be gained by taking the entire specification, claims, drawings, and abstract as a whole.

BRIEF DESCRIPTION

The disclosure may be more completely understood in consideration of the following description of various illustrative embodiments of the disclosure in connection with the accompanying drawings, in which:

FIG. 6A shows an illustrative waveform received by the signal conditioning circuit of FIG. 5;

FIG. 6B shows an illustrative waveform output by the signal conditioning circuit of FIG. 5;

Figure 1:
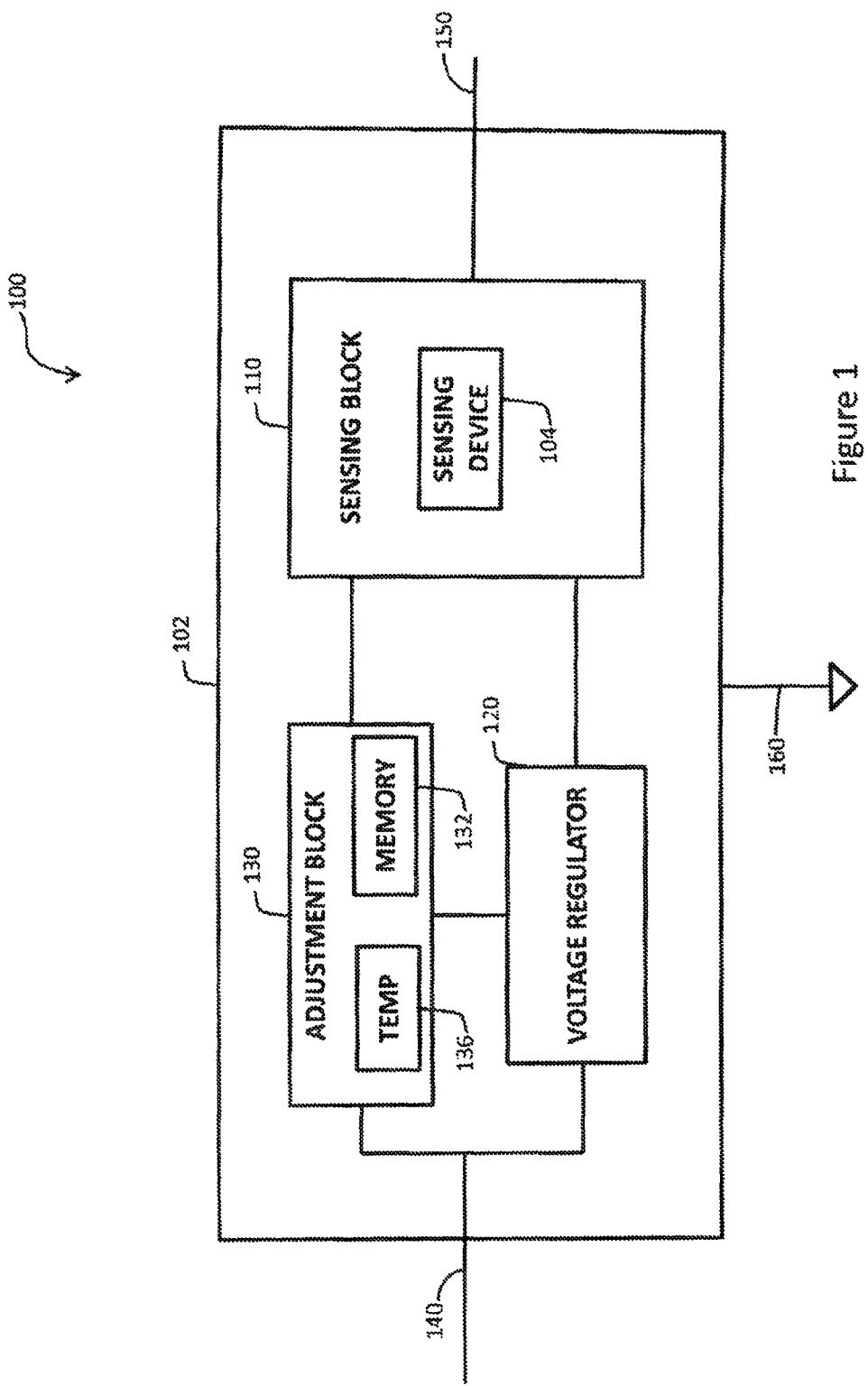
FIG. 1 is a block diagram of an illustrative packaged magnetic field sensor.

While the disclosure is amenable to various modifications and alternative forms, specifics thereof have been shown by way of example in the drawings and will be described in detail. It should be understood, however, that the intention is not to limit aspects of the disclosure to the particular illustrative embodiments described herein. On the contrary, the intention is to cover all modifications, equivalents, and alternatives falling within the spirit and scope of the disclosure.

DESCRIPTION

The following description should be read with reference to the drawings wherein like reference numerals indicate like elements throughout the several views. The description and drawings show several embodiments which are meant to be illustrative in nature.

FIG. 1 is a block diagram of an illustrative packaged magnetic field sensor 100. While a packaged magnetic field sensor 100 is shown in FIG. 1, it is contemplated that the present disclosure may be applied to any suitable sensor including pressure, flow, humidity, chemical, temperature, acceleration, airflow or any other suitable sensor or sensor type, as desired. The illustrative packaged magnetic field sensor 100 includes a package housing 102, with a magnetic field sensing device 104 situated in the package housing 102 for sensing a magnetic field. The package housing 102 may include a power input terminal 140, a ground terminal 160 and a sensor output terminal 150, all accessible from outside of the package housing 102. In some cases, the various terminals may be part of a lead frame (not shown) that is molded into the package housing. In some cases, the package housing may be a Single Inline Package (SIP) package, a Dual Inline Package (DIP) package, a Surface Mount (SMT) package, a package with Ball Grid Array (BGA) terminals, or any other suitable package. In some cases, the various terminals may be distributed on the substrate of the magnetic field sense die or within a package substantially similar in size to the sensor chip die, such that the magnetic field sensor may be used for applications using chip scale packaging.

In some instances, a sensing block 110 may be situated in the package housing 102 and electrically coupled to the magnetic field sensing device 104, as well as the sensor output terminal 150 of the package housing 102. An adjustment block 130 may be situated in the package housing 102, and may be coupled to the power input terminal 140 and the sensing block 110. The adjustment block 130 may receive one or more messages that include sensor adjustment information via the power input terminal 140. The one or more messages may be modulated onto the power input terminal 140. The adjustment block 130 may be configured to decode the received sensor adjustment information from the messages, and store the decoded adjustment information into a memory 132. In the illustrative embodiment, the adjustment block 130 may adjust the output signal of the sensing block 110 based on the decoded adjustment information.

In some instances, the adjustment block 130 may be used to adjust at least two parameters of the output signal on sensor output terminal 150 based on one or more sensor adjustment messages that are modulated onto the power input terminal 140 of the packaged magnetic field sensor 100. In some instances, each of the sensor adjustment messages may include a parameter field and a data field, wherein the parameter field may identify one of the at least two parameters of the output signal to adjust, and the data field may identify a measure related to an adjusted value for the identified parameter. The adjustable parameters may include, for example, a sensitivity, an offset, hysteresis amount, a symmetry, a differential, a temperature compensation amount, a linearity, a polarity, an operating point, a release point, and/or any other suitable parameter of the sensor, as desired.

In some cases, the adjustment block 130 may adjust the sensor output signal differently for each of two or more different temperature ranges. A memory 132 may be situated in the package housing 102 and may be coupled to the adjustment block 130. The memory 132 may store a first set of adjustment information used for adjusting the sensor output signal over a first temperature range, and may store a second set of adjustment information for adjusting the sensor output signal over a second temperature range. In some cases, the packaged magnetic field sensor 100 may include a temperature sensor 136 to provide a measure related to the temperature in the packaged magnetic field sensor 100.

In some cases, a voltage regulator 120 may be situated in the package housing 102 and may be coupled to the power input terminal 140. The voltage regulator 120 may provide a regulated supply voltage from the power input terminal 140 to the magnetic field sensing device 104, the sensing block 110 and the adjustment block 130 during operation of the packaged magnetic field sensor 100. In some cases, this may allow the packaged magnetic field sensor 100 to provide an output signal that is related to the sensed magnetic field while one or more messages are being modulated onto the power input terminal 140 and communicated to the packaged magnetic field sensor 100. In some cases, the adjustment information may be transmitted to the packaged magnetic field sensor 100, and the sensor output signal of the packaged magnetic field sensor 100 may be adjusted, without taking the packaged magnetic field sensor 100 off-line.

Typically, a power source may be applied to the power input terminal 140 to provide power to the packaged magnetic field sensor 100. Each of the sensing block 110, the voltage regulator 120 and the adjustment block 130 may include a connection (not shown) to the electrical ground terminal 160. It is contemplated that each of the sensing block 110, the voltage regulator 120 and/or the adjustment block 130 may include one or more discrete components (e.g., resistors, transistors, capacitors, inductors, etc.) and/or integrated circuits (e.g., operational amplifiers, flip flops, latches, shift registers, memories, ASICs, etc.), depending on the application.

In some cases, the packaged magnetic field sensor 100 may be configured as a digital sensor, such as a continuous time Hall Effect latch or a chopper stabilized Hall Effect latch, but this is not required. In one example, a continuous time latch may use analog signal processing circuits that are continuously connected. In another example, a chopper stabilized latch may be configured to compensate for dc offsets by sequentially switching between two or more inputs to cause the dc offsets to be modulated to a higher frequency, which can then be filtered and/or otherwise removed from the latched output signal. While a chopper stabilized latch may be able to maintain high sensitivity over a wide range of operating temperatures by attenuating dc offset effects, switching inherently introduces ac noise that appears as jitter on the output signal. Continuous time latches do not include such ac switching noise, and may have better repeatability and a higher bandwidth (faster response time). However, dc offsets and/or other sensor characteristics may need to be compensated and/or adjusted to help ensure that the output characteristics of the packaged magnetic field sensor 100 remain within specified limits. For example, the sensor characteristics of continuous time and/or chopper stabilized sensor units may be compensated during production (e.g., end-of-line calibration) and/or at a customer site (e.g., application specific calibration). In some cases, the calibration data may be determined using an algorithm, look-up table and/or other similar methods. In other cases, the output of the packaged magnetic field sensor 100 may be monitored during the calibration process. For example, the calibration information may be programmed using feedback from the sensor to help ensure that the operating characteristics of the packaged magnetic field sensor 100 are or remain within specified limits. In some cases, the identified calibration information may be locked or otherwise protected so that noise and/or other electromagnetic interference do not cause the data to be overwritten erroneously. For example, the memory 132 may include a non-volatile memory, and may be locked using a permanent method (e.g., blowing a fuse) and/or an electronic method (e.g., high bit count, electronic enable signals, etc.), as further described below.

In some cases, appropriate calibration information may be communicated to the packaged magnetic field sensor 100 as a serial bit stream of data, which is modulated onto a supply voltage signal applied to the power input terminal 140. In some cases, the modulated data may be at a higher voltage than a normally specified power voltage. In such cases, the voltage regulator 120 may be used to filter and/or regulate the supply voltage levels within the packaged magnetic field sensor 100 to help protect the internal circuitry and to help ensure the proper and stable operation of the internal circuitry. For example, if the power input terminal 140 includes a 5V DC powersupply voltage with modulated data that is above 5V, the voltage regulator may deliver a relatively stable 2.0V-5.0V power supply voltage to the sensing block 110, the sensing device 104, and some circuitry in the adjustment block 130, if desired.

In some cases, the adjustment block 130 may be configured to demodulate and/or decode the adjustment information on the power input terminal 140, and store the resulting adjustment information within memory 132 (e.g., an EEPROM, EPROM, RAM, etc.). In some cases, the adjustment information may be updated over time and stored multiple times. In other cases, the adjustment information may be stored only once. The adjustment block 130 may include circuits to adjust, for example, the sensitivity, offset, hysteresis, symmetry, and/or other characteristics of the packaged magnetic field sensor 100 using the adjustment information stored in the memory 132.

In some embodiments, the adjustment information may correspond to operation at a specific temperature and/or over specific temperature ranges (e.g., 25° C., 50° C., from about 10° C. to about 60° C., etc.). In some cases, the memory 132 may store adjustment information for two or more different temperatures and/or temperature ranges. For example, the packaged magnetic field sensor 100 may operate using a first set of adjustment information within a first temperature range (e.g. 0° C. to about 60° C.), and a second set of adjustment information within a second temperature range (e.g. 60° C. to about 125° C.). In some cases, the packaged magnetic field sensor 100 may switch between the first and second sets of adjustment information using temperature information from temperature sensor 136 or some other temperature source, as desired.

In some cases, the packaged magnetic field sensor 100 may be configured to use the voltage regulator 120 to internally regulate the voltage near a specified voltage level or within a specified range of voltages (e.g., from about 3 volts to about 25 volts). For example, the voltage regulator 120 may be used to protect the adjustment circuit 130 and/or the sensing circuit 110 from over-voltage and/or noisy conditions. In some cases, the voltage regulator 120 may include an amplifier and/or charge storage device to help protect against under-voltage conditions and/or transient power loss conditions over a specified time period (e.g., several milliseconds) on the incoming power signal. In some cases, an external voltage regulator may be used, if desired.

The sensing circuit 110 may include one or more sensing devices 104 capable of sensing a magnetic field, such as one or more Hall Effect sensing elements (e.g., four Hall Effect Sensing elements), and/or one or more anisotropic magnetoresistance (AMR) meters. The sensing circuit 110 may be configured to output a signal via the sensor output terminal 150, where the output signal may provide a measure that relates to a sensed magnetic field, such as field strength, magnetic flux density, magnetic field direction, etc.

Figure 1A:
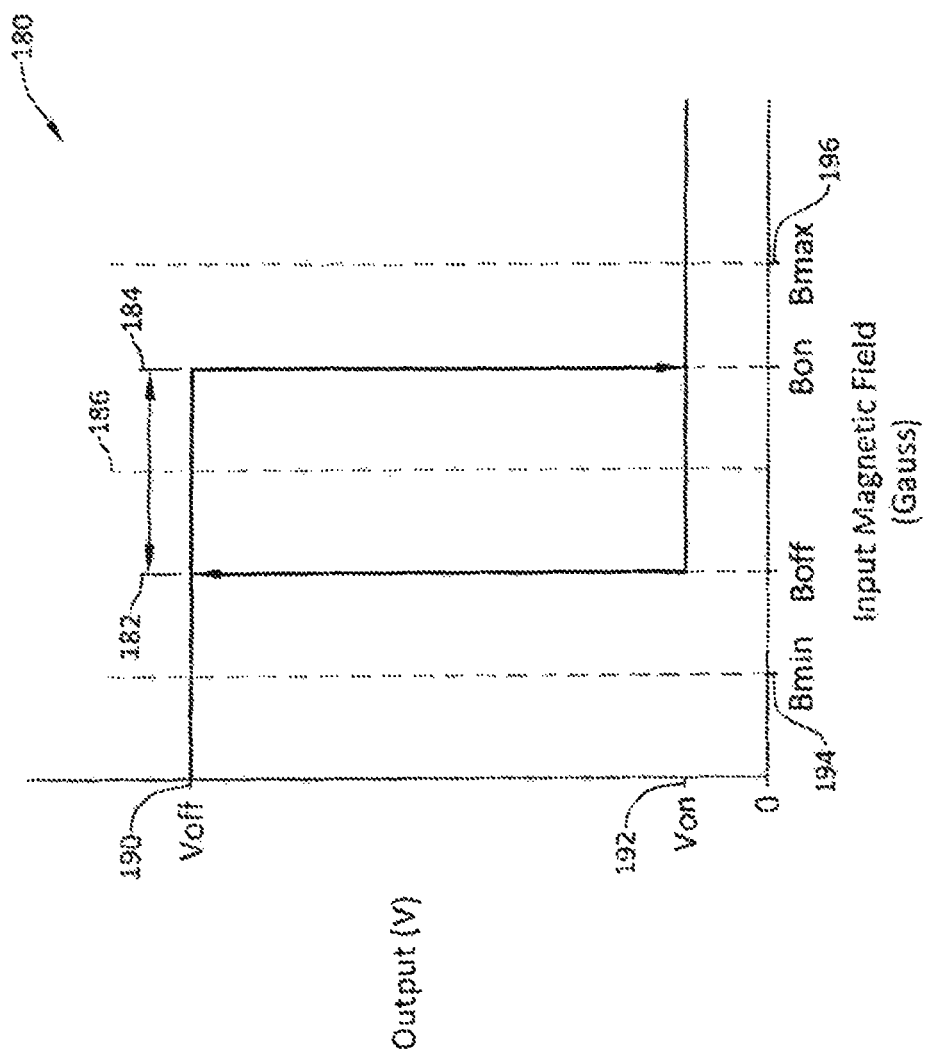
FIG. 1A illustrates characteristics of an output signal from the illustrative magnetic field sensor of FIG. 1.

The packaged magnetic field sensor 100 may be configured for unipolar operation and/or bipolar operation and/or absolute operation (polarity insensitive). In some cases, the output signal may be an analog signal that corresponds to the sensed magnetic field, or the output signal may be a digital signal that corresponds to the sensed magnetic field. In an example, the digital signal may be a square wave output having a frequency that corresponds to the strength of the sensed magnetic field. The packaged magnetic field sensor 100 may have a transfer function corresponding to the output of the Hall Effect sensing elements, where the transfer function may have certain characteristics (e.g., sensitivity, differential, null offset, span, etc.). For example, sensitivity may be defined as the change in output resulting from a given change in input magnetic field. The Hall Effect sensing element may output an analog signal that may be converted to a digital signal within the packaged magnetic field sensor 100. For example, the packaged magnetic field sensor 100 may have two states, on or off, as illustrated with the characteristic curve of FIG. 1A. In one example, the sensing block 110 may include a comparison circuit (e.g., a comparator, a Schmitt trigger, etc.) capable of comparing the output of a Hall Effect sensing element 104 to a specified threshold voltage level. When the output of a Hall Effect sensing element 104 exceeds the threshold (e.g., Bon 184), the sensing block 110 may be configured to turn on (e.g., draw a current, output a voltage substantially similar to ground 160, such as Von 192, etc.), and when the output of the Hall Effect sensing element 104 falls below a threshold (e.g., Boff 182), the sensing block 110 may be configured to turn off (e.g., stop drawing a current, output a voltage substantially close to the power input voltage, such as Voff 190, etc.). Symmetry may be defined such that a symmetry value 186 lies at the midpoint between the Bon threshold 184 and the Boff threshold 182. For example, when Bon 184 equals 50 Gauss and Boff 182 equals 20 Gauss, the symmetry value would equal 35 Gauss.

In some cases, hysteresis is included in the output to reduce jitter, false triggers, and/or other switching related problems. For example, the hysteresis may include a first switching threshold Bon 184 for turning the output "on" and a second switching threshold Boff 182 for turning the output "off". In some cases, the packaged magnetic field sensor 100 may be unipolar (e.g., wherein the both the first threshold Bon 184 and the second threshold Boff 182 are the same polarity), or bipolar (e.g., where the first and second thresholds are of opposite polarity). In some cases, the first threshold Bon 184 and the second threshold 182 may be variable between a minimum level Bmin 194 and a maximum level Bmax 196. For example, by varying the symmetry value 186, the Bon threshold 184 and the Boff threshold 182 may be moved between the minimum level Bmin 194 and the maximum level Bmax 196.

In some cases, the characteristics of the packaged magnetic field sensor 100 (e.g., sensitivity, offset, hysteresis, symmetry, etc.) may adjusted based on an environmental characteristic, such as temperature. In other cases, the characteristics of the packaged magnetic field sensor 100 may be adjusted based on other factors, such as differences between component characteristics within the sensor, differences desired in different applications in the field, etc.

To adjust for such differences, the adjustment circuit 130 may be used to trim and/or otherwise adjust one or more parameters of the packaged magnetic field sensor 100, such that the output characteristics (e.g., sensitivity, offset, hysteresis, symmetry, etc.) remain within a specified range. For example, the adjustment circuit 130 may include a hysteresis adjustment circuit that is configured to adjust the differential between the first threshold and the second threshold (e.g., the switch "on" threshold and the switch "off" threshold discussed above). In some cases, the adjustment circuit may be configured to adjust the symmetry about a specified magnetic field value.

Figure 2:
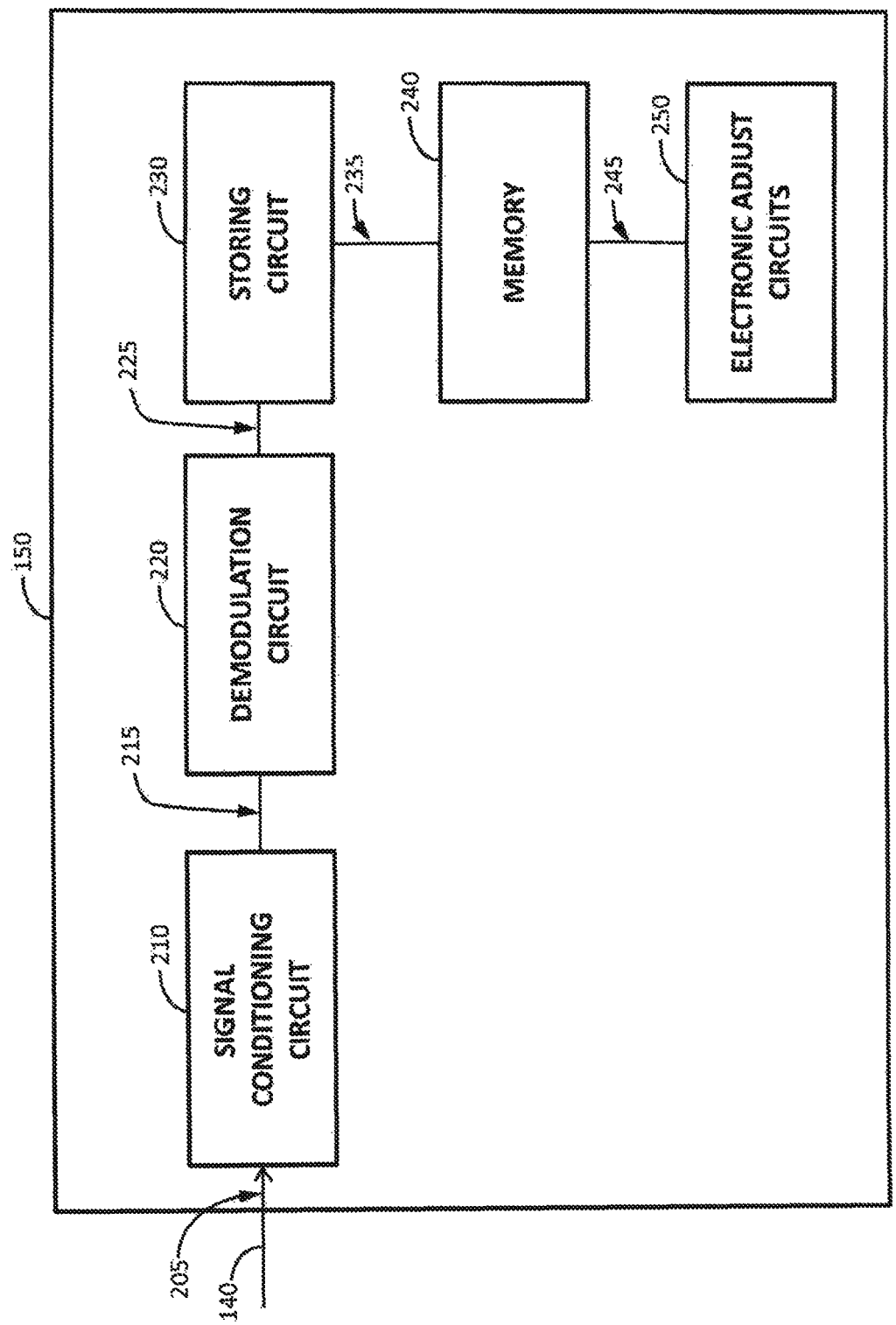
FIG. 2 is a block diagram of an illustrative adjustment block shown in FIG. 1.

FIG. 2 is a block diagram of an illustrative adjustment block, such as adjustment block 130 shown in FIG. 1. In some cases, the adjustment block 130 may receive a modulated signal 205 (e.g., a bit encoded data stream) modulated onto power input terminal 140 of the packaged magnetic field sensor 100. The modulated signal 205 may be received by a signal conditioning circuit 210, where the conditioned signal 215 may be demodulated by a demodulation circuit 220. A modulation envelope data stream and/or clock signal 225 may be used by a storing circuit 230 to store adjustment information 235 (e.g., offset adjustment information, hysteresis adjustment information, etc.) into a memory 240 (e.g., a EEPROM, a EPROM, etc.) and/or to configure one or more electronic adjustment circuits 250 to adjust the output characteristics of the sensing circuit 110 as desired.

It is contemplated that the memory 240 may provide a number of stored bits 245 to the electronic adjustment circuits 250. These bits may control or adjust one or more characteristics of the sensor output signal on the sensor output terminal 150 of the packaged magnetic field sensor. In some cases, a data word of the memory may have N bits. In some cases, a first sub-group of bits of the memory data word (e.g. bits 1-8) may store control bits for adjusting a first parameter of the packaged magnetic field sensor (e.g. differential), a second sub-group of bits of the memory data word (e.g. bits 9-16) may store control bits for adjusting a second parameter of the packaged magnetic field sensor (e.g. symmetry), and a third sub-group of bits of the memory data word (e.g. bits 17-18) may store control bits for adjusting a third parameter of the packaged magnetic field sensor (e.g. sensitivity), etc. Thus, when a particular data word is selected from the memory, all of the control bits are made available to adjust the corresponding parameters of the packaged magnetic field sensor.

In some cases, the memory 240 may store a number of data words, and may output a selected data word to the electronic adjustment circuits 250. The particular data word that is selected may depend upon the ambient conditions such as temperature, on the current sensed magnetic field value, as well as other factors. For example, when the ambient temperature is in a first temperature range, a first data word in the memory 240 may be presented to the electronic adjustment circuits 250, and when the ambient temperature is in a second temperature range, a second data word in the memory 240 may be presented to the electronic adjustment circuits 250 (e.g. to automatically adjust the temperature compensation parameters of the sensor for increased accuracy). Likewise, when the magnitude of the current sensed magnetic field is relatively low, a first data word in the memory 240 may be presented to the electronic adjustment circuits 250, and when the magnitude of the current sensed magnetic field is relatively high, a different data word in the memory 240 may be presented to the electronic adjustment circuits 250 (e.g. to automatically adjust the sensitivity and/or range of the sensor). These are just some examples.

Figure 3:
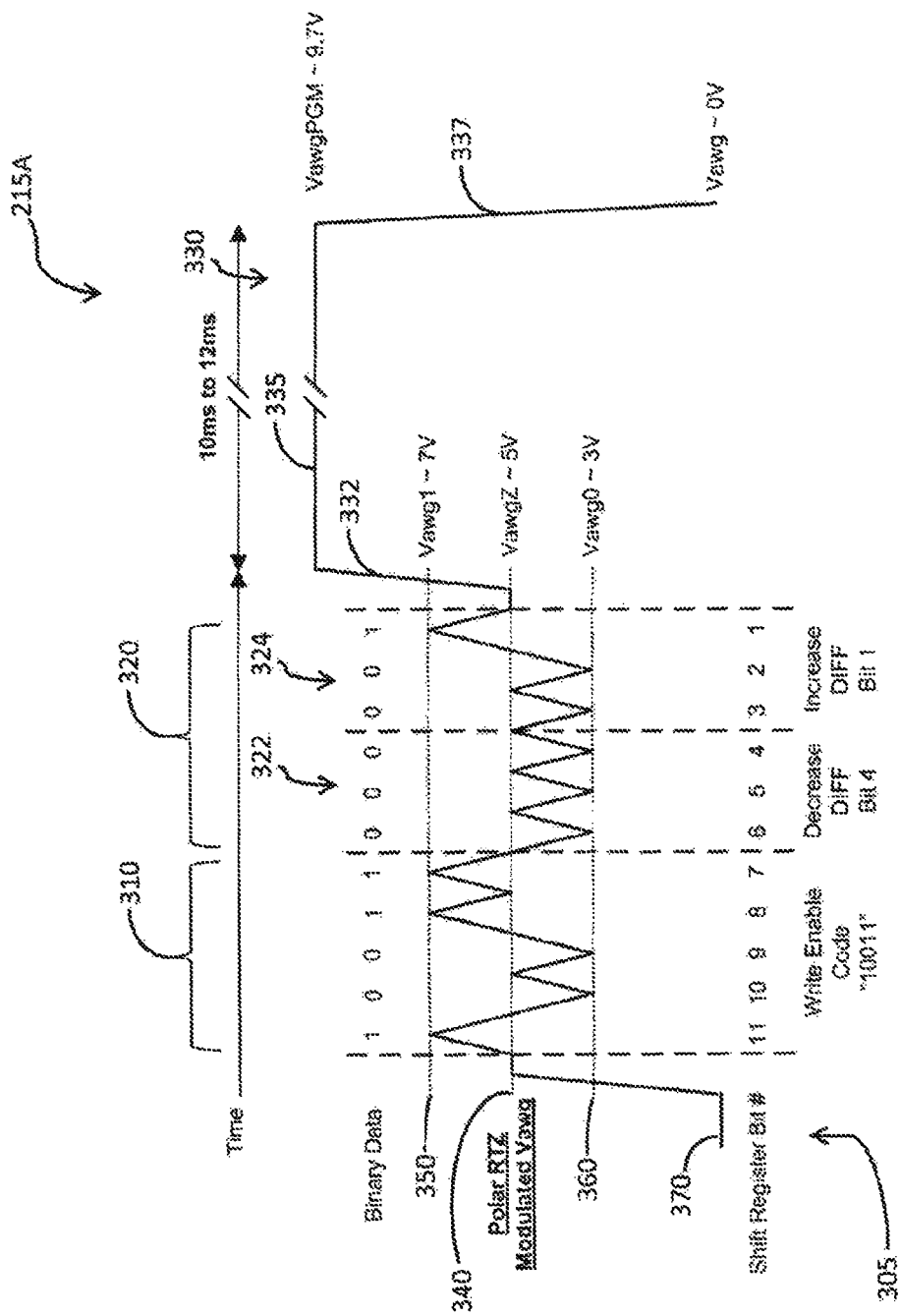
FIGS. 3 and 4 show illustrative bit sequence adjustment messages modulated onto a power input terminal of the packaged magnetic field sensor of FIG. 1.
Figure 4:
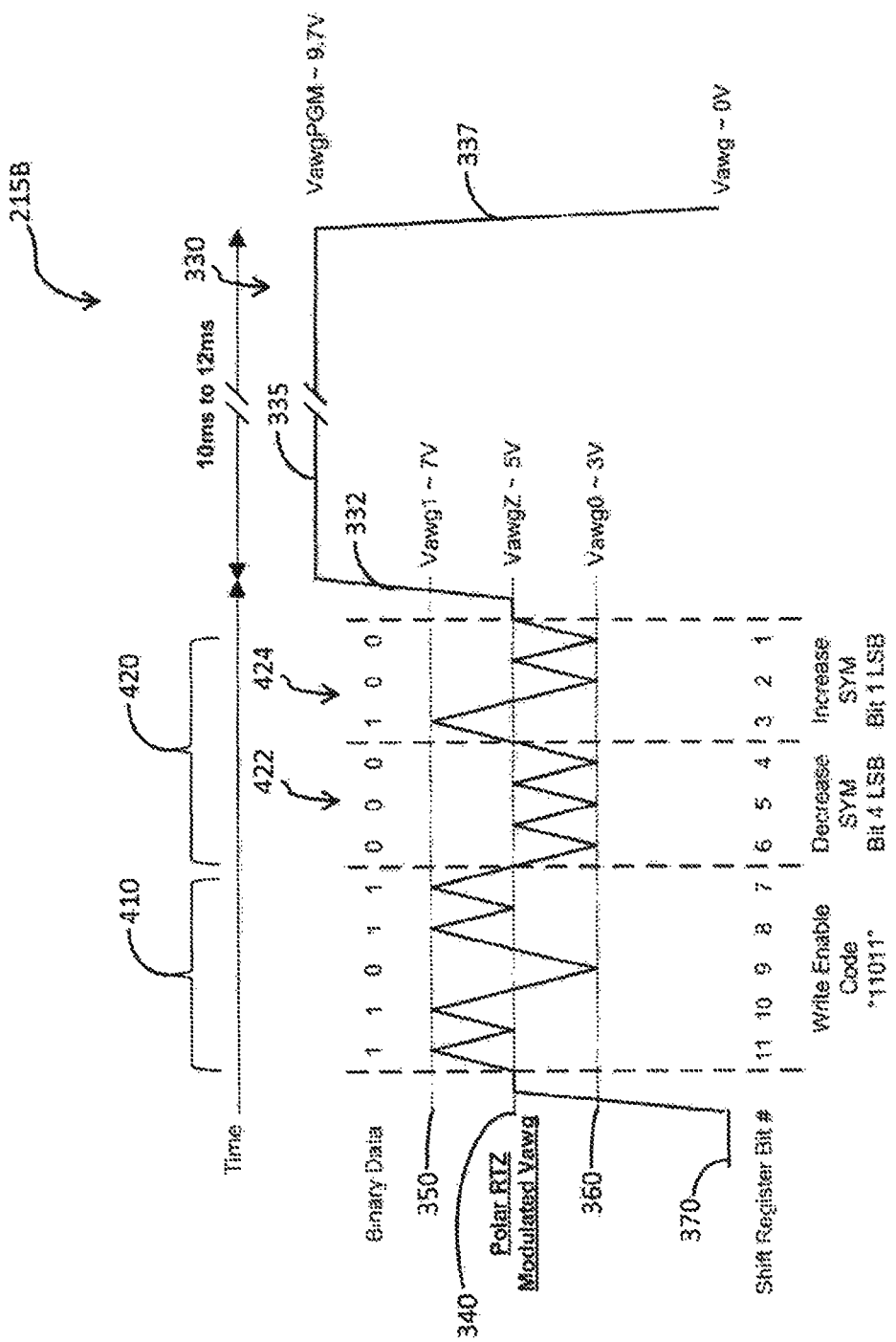

FIGS. 3 and 4 show illustrative bit sequence adjustment messages 215A and 215B from modulations on power input terminal 140 of the packaged magnetic field sensor 100 of FIG. 1. In the example shown, message 215A of FIG. 3 may correspond to a modulated message configured to communicate differential adjustment information, and the message 215B of FIG. 4 may correspond to a modulated message configured to communicate symmetry adjustment information. The bit sequence messages 215A, 215B may be sent as a series of data bits over time, where each data bit may be sent over a specified time period (e.g., about 50 us, about 100 us, etc.) per bit.

The bit sequence messages 215A, 215B may include a starting transition 305, a parameter field 310, a data field 320 which may include a decreasing differential field 322 and an increasing differential field 324. In some cases, a data field 420 may include a decreasing symmetry field 422 or an increasing symmetry field 424. In some cases, the messages 215 may include a data lock field configured to enable and/or disable memory lock functionality. The bit sequence message may conclude with transitions 332, followed by 335 and ending with 337 which combine to program the data into memory 240.

In some cases, the data bits of the messages 215A, 215B may be encoded in one or more formats, such as a polar return-to-zero format, where a logic "1" may be represented by a transition from a defined central voltage 340 to an upper voltage 350 and back to the defined central voltage, and where a logic "0" may be represented by a transition from the central voltage 340 to a lower voltage 360 and back. In some embodiments, a transition from the central voltage 340 to a fourth voltage level 335 and back to about zero volts 370 may indicate a programming command. The programming command may be held for a longer duration than the individual bits, such as for about 10 milliseconds to about 12 milliseconds. In cases where a bipolar power supply is used, the center voltage may be 0 volts. In cases where a unipolar power source is used, the central voltage may be a non-zero value (e.g., about 10 V).

In some cases, the bit sequence messages 215 may start with a transition 305 from a first voltage 370 (e.g., about 0V) to the central voltage 340 (e.g., about 10V, etc.). The bit sequence messages 215 may include a specified number of bits (e.g., 11) divided between the parameter field 310 and the data field 320. In the example shown, the parameter field 310 may include the first 5 bits of the bit stream and the data field may include the next 6 bits. The bits of the data field 320 may be further sub-divided such that one or more of the first 3 bits may correspond to a command to increase the differential of the packaged magnetic field sensor 100, and the second 3 bits may correspond to a command to decrease the differential of the packaged magnetic field sensor 100. Data encoded within the parameter field 310 may indicate an adjustment parameter and/or an adjustment amount for one or more of the characteristics of the packaged magnetic field sensor 100. For example, a bit stream of '10011' (e.g., parameter field 310) may indicate a differential adjustment, and a bit stream of '11011' (e.g., parameter field 410) may indicate a symmetry adjustment. In some cases, individual bits within the data field may be used to indicate an incremental adjustment, such as using bit 1 and bit 4 of the data field 320. In other cases, the data fields 422, 424 of FIG. 4 may be used to express an adjustment amount, such as an amount represented by three digit binary adjustment (e.g., between 0 and 7 decimal).

Figure 5:
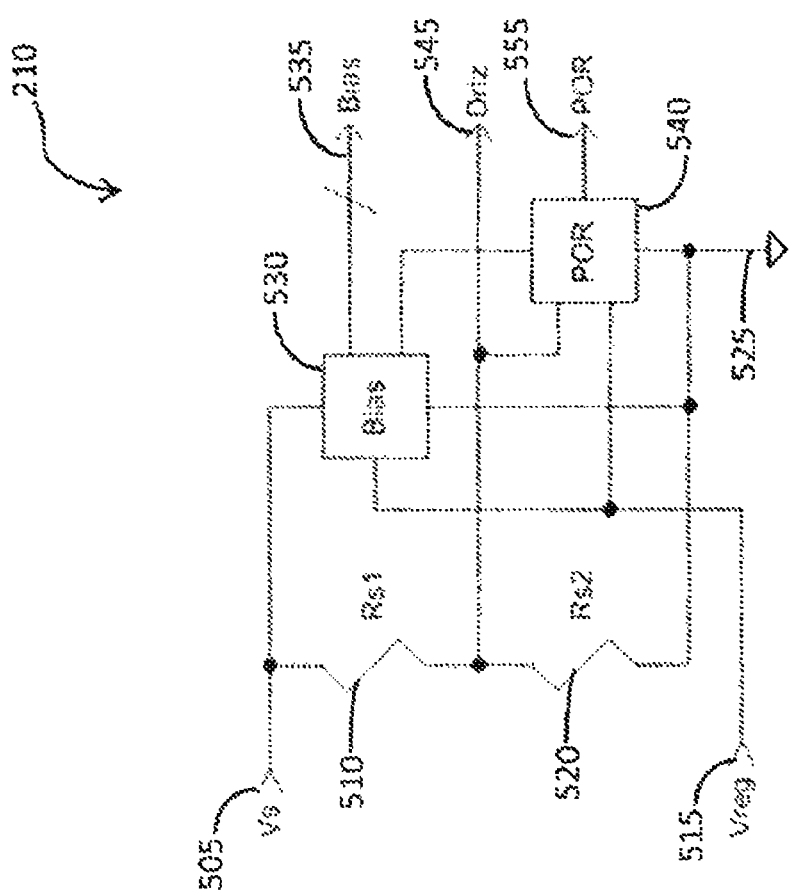
FIG. 5 is a schematic diagram of an illustrative signal conditioning circuit of the adjustment block of FIG. 2.

FIG. 5 is a schematic diagram of an illustrative signal conditioning circuit 210 of the adjustment block of FIG. 2. In the example shown, the signal conditioning circuit 210 may include one or more inputs including a voltage source input 505, a regulated voltage input 515, and an electrical ground input 525, and one or more outputs such as a bias current output 535, a conditioned signal output 545 and a power on reset output 555. In some cases, the signal conditioning circuit 210 may include one or more components to scale or otherwise condition the voltage signal received from the voltage source input 505. For example, resistors 510, 520 may be used as a voltage divider to produce a scaled polar return-to-zero signal at the conditioned signal output 545. A bias circuit 530 may be provided to provide one or more biasing currents via the bias current output 535 used for one or more components of the demodulation circuit 220. In some cases, the voltage regulator 120 may be configured to manage the power used by one or more components of the adjustment circuit 130 and/or sensing circuit 110. In some cases, a power on reset circuit 540 may be provided to generate a signal to reset one or more components (e.g., flip flops, latches, shift registers, etc.) of the demodulation circuit 220 and/or the storing circuit 230 during transition 360.

FIG. 6A shows an illustrative waveform 600 received by the signal conditioning circuit 210 of FIG. 5. In the example shown, a message 600 is modulated onto power input terminal 140 (e.g., a constant DC voltage) from a signal source, so that the information contained in the message 600 can be decoded and identified by the adjustment block 130 (e.g., modulated signal 205 of FIG. 2). A data bit having a logic value of '1' may be modulated onto the voltage signal 600, wherein the data bit 625 may be identified by a positive transition from a central voltage 610 (e.g., about 10 V) to an upper voltage 620 (e.g., about 14 V) and back to the central voltage 610. Likewise, a data bit having a logic value of '0' may be modulated onto the voltage signal 600 wherein the data bit 635 may be identified by a negative transition from the central voltage 610 (e.g., about 10 V) to a lower voltage 630 (e.g., about 6 V) and back to the central voltage 610., FIG. 6B shows an illustrative scaled polar return-to-zero waveform 650 on the signal conditioned output 545 from the signal conditioning circuit 210 of FIG. 5. The scaled polar return-to-zero waveform 650 may be a scaled and/or translated version of the modulated waveform 600. In the example shown, the amplitude of the scaled waveform 650 may be a fraction of the amplitude of the modulated waveform 600. For example, the scaled polar return-to-zero waveform 650 may have a central value 655 (e.g., about 5 V), an upper value 660 (e.g., about 7 V), and a lower value 665 (e.g., about 3 V). In an example, a second threshold may be used, such as for noise immunity, such as a logic "1" threshold 670 and a logic "0" threshold 675, wherein the waveform must pass either the logic "1" threshold 670 or the logic "0" threshold 675 to be considered a logic "1" or a "0", respectively. In an example, the logic "1" threshold 670 and the logic "0" threshold 675 may be approximately equidistant from the central value 655, but that is not required. In some cases, when the packaged magnetic field sensor 100 is being powered on, the power on reset (POR) signal may be reset when the polar return-to-zero waveform crosses a POR threshold 680.

Figure 7:
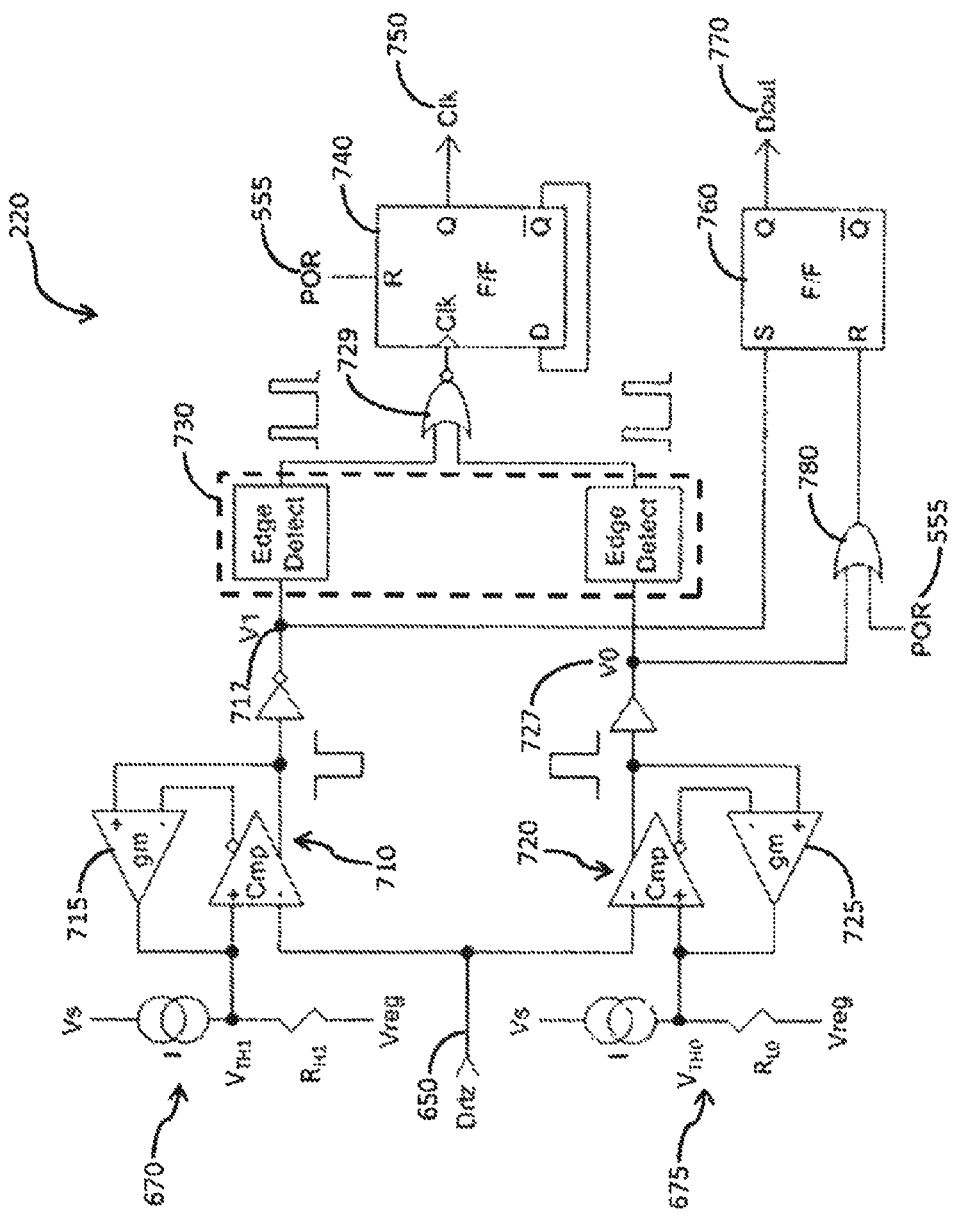
FIG. 7 is a block diagram of an illustrative demodulation circuit of the adjustment block of FIG. 2.

FIG. 7 is a block diagram of an illustrative demodulation circuit 220 of the adjustment block 130 of FIG. 2. In some embodiments, the demodulation circuit 220 may receive the scaled polar return-to-zero waveform 650 from the signal conditioning circuit 210 of FIG. 6B. The scaled polar return-to-zero waveform 650 may be compared to the logic "1" threshold voltage 670 and/or the logic "0" threshold voltage 675 using one or more comparison circuits 710/720. The comparison circuits 710, 720 may include devices such as transconductance amplifiers 715, 725 to introduce hysteresis around the switch points to help reduce switching noise (e.g., chatter, jitter, etc.). A voltage pulse signal V1 717 may be generated by the comparison circuit 710 corresponding to a logic "1" bit of the polar return-to-zero waveform 650, and a second voltage pulse V0 727 may be generated by the comparison circuit 720 corresponding to a logic "0" bit of the scaled polar return-to-zero waveform 650. In some cases, the demodulation circuit 220 may be configured to also output a clock signal 750 corresponding to the communication rate of the scaled polar return-to-zero waveform 650 (e.g., about 1 kHz, about 2 kHz, etc.).

The voltage pulse signals V1 717 and V0 727 may be fed into a respective edge detector 730 and then used to clock the flip-flop 740 through a NOR gate 729. The output of the flip-flop 740 is divided by 2, to generate the clock signal 750 having the same communication rate as the polar return-to-zero data stream 650. The modulation envelope, Dout 770, may be generated from the voltage pulse signals V1 717 and V0 727 using an SR flip-flop 760. The V1 717 pulse signal may be fed into the set input of the flip-flop 760 and the V0 727 pulse signal may be fed into the reset input of the flip-flop 760. In some cases, the clock signal 750 and/or the modulation envelope 770 may be reset, such as in a power up condition. In these cases, the POR signal 555 generated by the signal conditioning circuit 210, may be connected to the reset input of the flip-flop 740 to reset the clock signal 750 and connected through OR gate 780 to the reset input of the flip-flop 760 to reset the modulation envelope 770. While discrete circuits are shown in block diagram form in FIG. 7, the demodulation circuit 220 may be constructed out of one or more other discrete components, integrated circuits, microcontrollers, microprocessors, Application Specific Integrated Circuits (ASICs), and/or the like.

Figure 8:
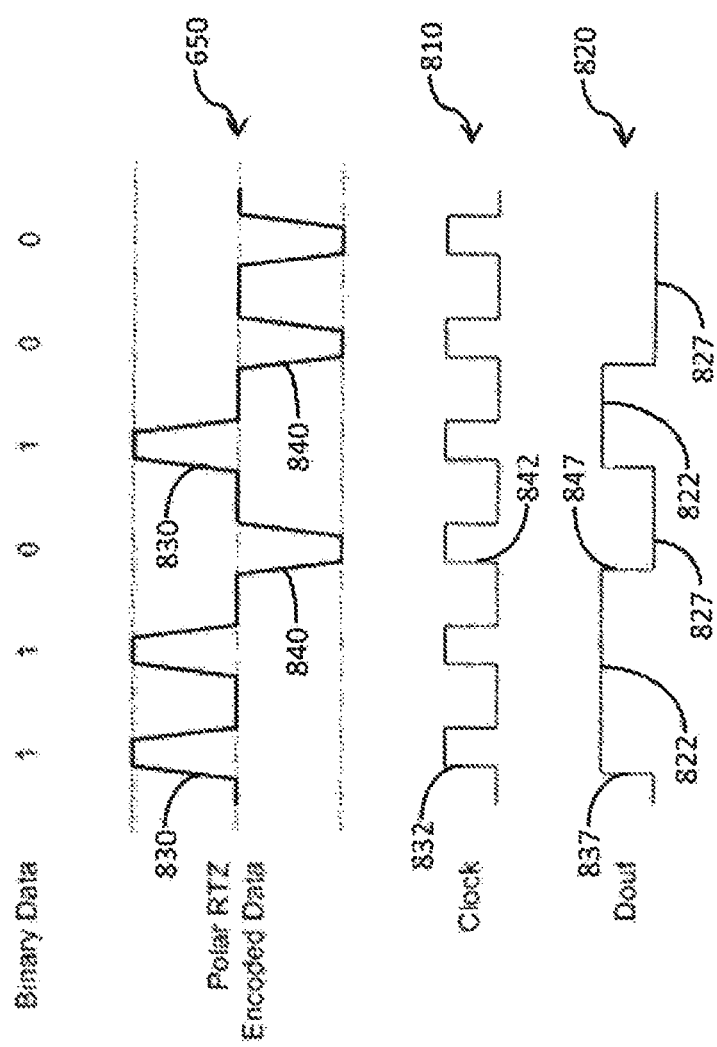
FIG. 8 shows illustrative waveforms output by the demodulation circuit of FIG. 7.

FIG. 8 shows illustrative waveforms output by the demodulation circuit 220 of FIG. 7. As discussed above, the demodulation circuit 220 may output a clock signal 810 and/or a modulation envelope 820 generated from the scaled polar return-to-zero waveform 650. In the example shown, the polar return-to-zero waveform 650 may include one or more positive polarity pulses 830 corresponding to a logic "1" and one or more negative polarity pulses 840 corresponding to a logic "0". The rising edge of pulse 830 of a logic "1" bit and/or the falling edge of pulse 840 of a logic "0" bit may both correspond to a rising edge of the clock signal 810. The modulation envelope 820 may correspond to the scaled polar return-to-zero waveform 650 such that the transition edges of the modulation envelope 820 may slightly precede the rising edges of the clock signal 810. The modulation envelope 820 may remain high (e.g., output level of the voltage regulator 120) as shown at 822, which corresponds to one or more logic "1" bits of the scaled polar return-to-zero waveform 650 until a negative polarity pulse 840 is received. At such time, the modulation envelope 820 falls to the low level 827 (e.g., 0 volts) until another positive polarity pulse 830 is received and/or the signals are reset.

Figure 9:
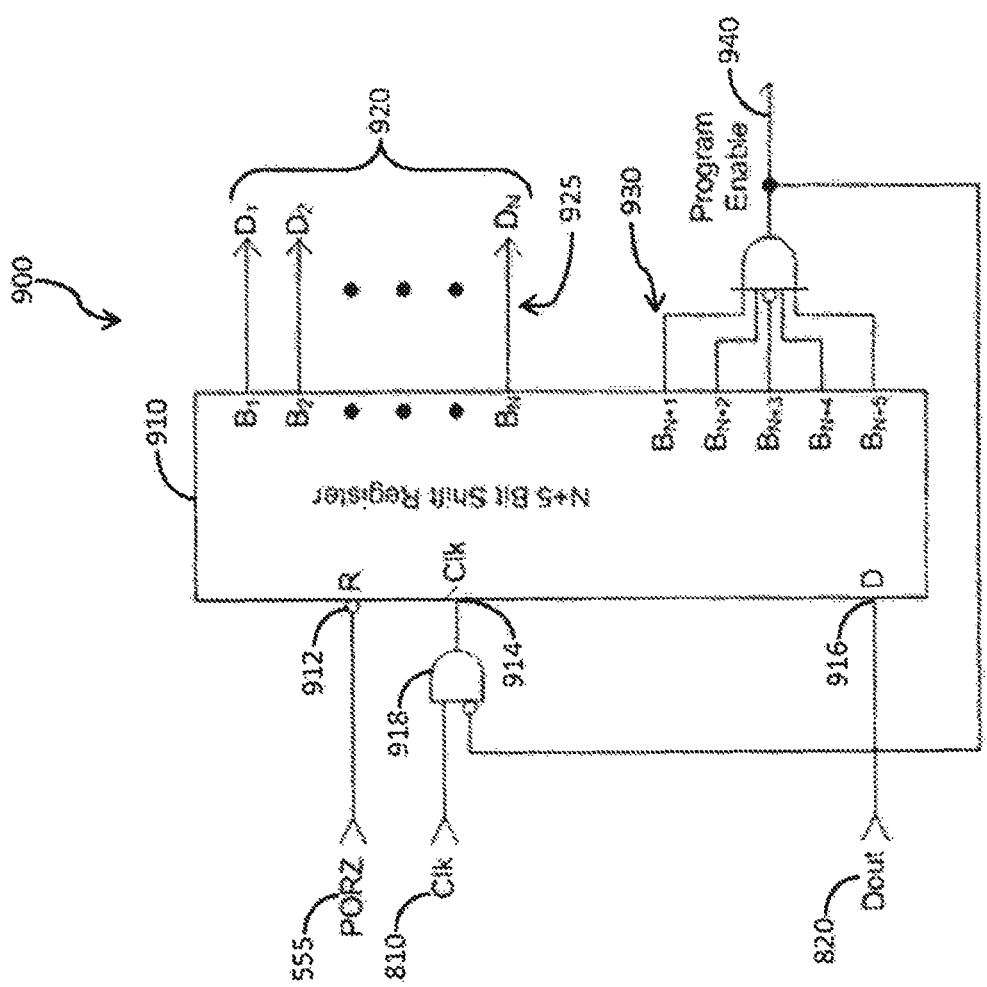
FIG. 9 shows a block diagram of an illustrative storing circuit of the adjustment block of FIG. 2.

FIG. 9 shows a block diagram of an illustrative storing circuit 900 of the adjustment block 150 of FIGS. 1 and 2. In some cases, the storing circuit 900 may be configured for parallel writing of data 920 to memory 240. For example, the storing circuit 900 may include a shift register 910 configured to receive the POR signal 555 on a reset input 912, the clock signal 810 at the clock input 914, and the modulation envelope 820 at the data input 916. In some cases, the clock signal may be connected via a NAND gate 918 to disable the clock input, such as when a program (i.e. write) enable signal is asserted. The serial data stream (e.g., 320, 420) may be converted into parallel data lines 920 which may, for example, be stored simultaneously into the memory 240 when the program enable is asserted. In some cases, the parallel writing of the data bits into the memory is faster than serial writing of data bits into the memory, which may speed production time and/or throughput. The shift register 910 may be selected based on the length of the parameter and data fields within a bit sequence adjustment message. For example, message 215B is comprised of a 5 bit parameter field 410 containing program enable code 930 (i.e. "11011") and a 6 bit data field 420 containing a symmetry adjust code (i.e. "000100") which requires a shift register 910 length of 11 bits.

Figure 10:
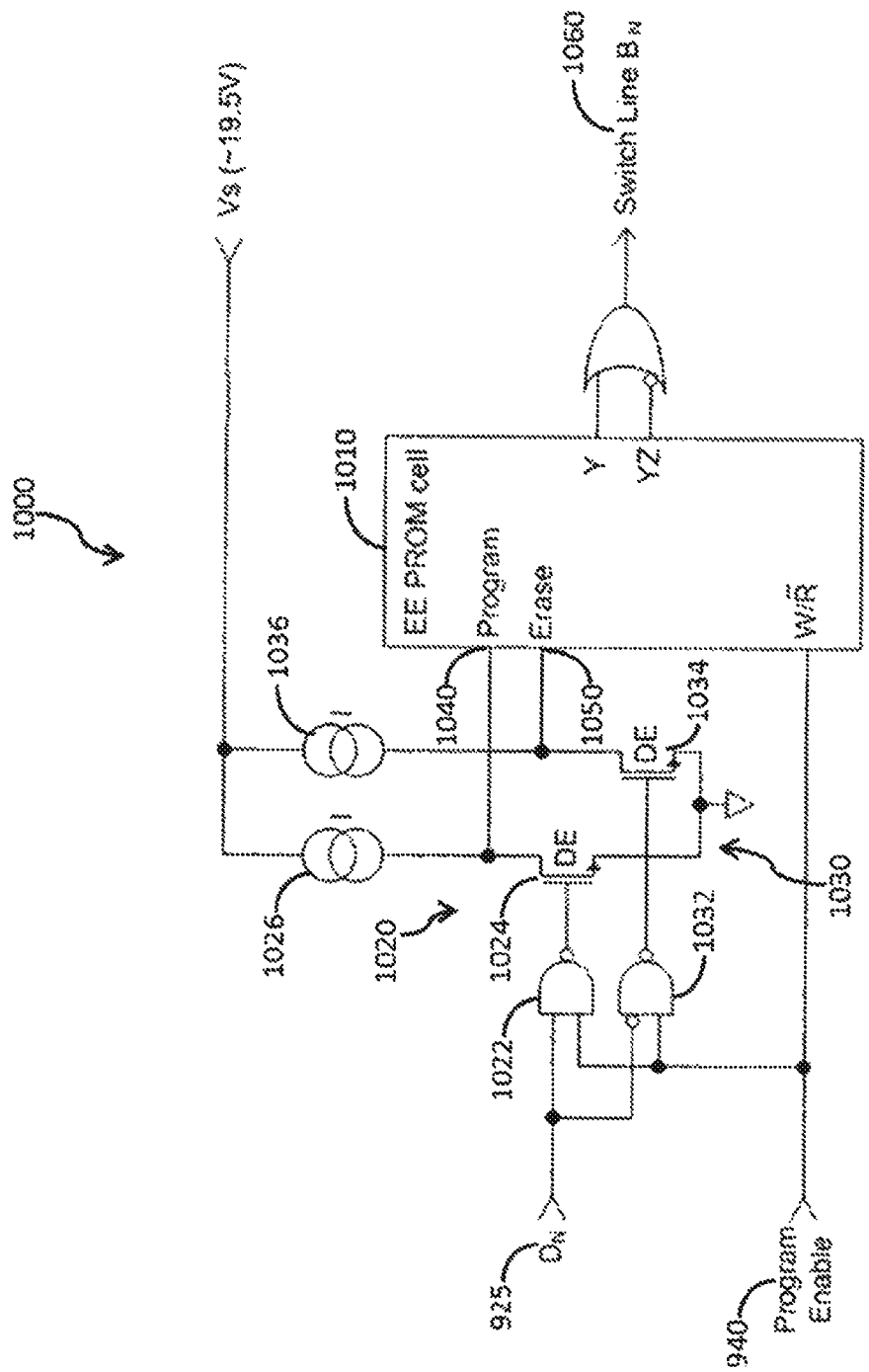
FIG. 10 shows a block diagram of an illustrative memory circuit of the adjustment block of FIG. 2.

FIG. 10 shows a block diagram of an illustrated memory circuit 240 of FIG. 2. For example, the memory 240 may include one or more memory cells 1000 which each contain an EEPROM cell 1010 or other memory device. The data signal 925 of the data line $D_N$ may be stored within the corresponding Nth memory cell 1000. For example, interface 1020, used for storing a logic "1" in the corresponding EEPROM cell 1010, may include a NAND gate 1022, a transistor 1024 (e.g., a MOSFET, a drain extended N-channel MOSFET, etc.) and a load (e.g., current source 1026, a transistor, a resistor, etc.). Similarly, the interface 1030 may be used for storing a logic "0" in the corresponding EEPROM cell 1010 using a NAND gate 1032, a transistor 1034, and a current source load 1036. In the example shown, to store a logic "1" in the memory cell 1000, the data signal 925 is compared to the program enable line 940 using the NAND gate 1022, and if both are a logic "1", the gate of transistor 1024 is set to zero, driving the voltage on the Program line 1040 of the EEPROM cell 1010 to the supply voltage. This writes a logic "1" to the EEPROM cell 1010. Likewise, to store a logic "0" in the memory cell 1000, the inverted data signal 925 is compared to the program enable line 940 using the NAND gate 1032, and if both are a logic "1", the gate of transistor 1034 is set to zero, driving the voltage on the Erase line 1050 of the EEPROM cell 1010 to the supply voltage.

This writes a logic "0" to the EEPROM cell 1010. To use the data stored in memory cell 1000 to control the electronic adjust circuits 250 in FIG. 2, the program enable line 940 is held at a logic "0" which forces the program line 1040 and erase line 1050 to logic "0". This reads the data stored in the EEPROM cell 1010 and drives the output data bit $B_N$ 1060 to the stored logic level.

Figure 11:
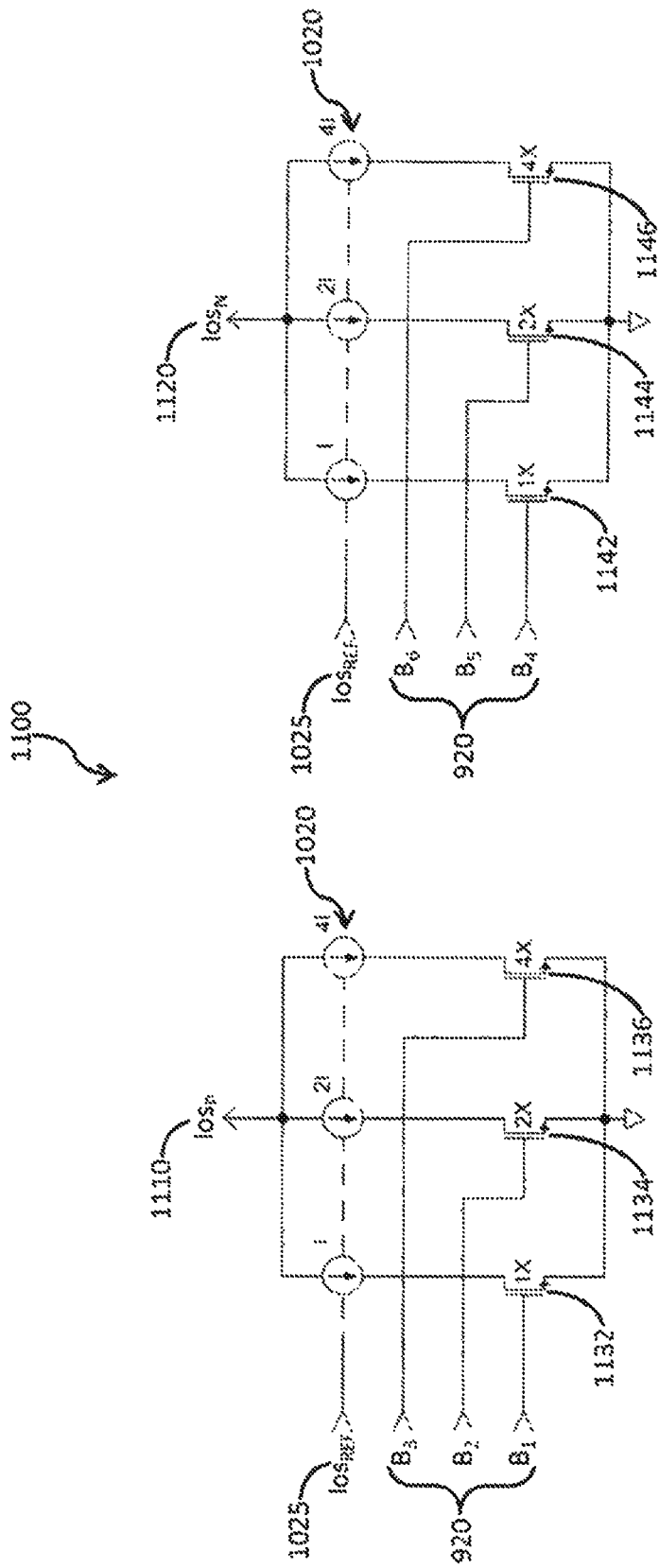
FIG. 11 is a block diagram of an illustrative symmetry adjustment circuit for adjusting the symmetry (i.e. offset) of a packaged magnetic field sensor.

FIG. 11 is a block diagram of an illustrative symmetry adjustment circuit 1100 for adjusting the symmetry of a packaged magnetic field sensor. In the example shown, the symmetry adjustment circuit 1100 is configured to provide one or more symmetry adjustment currents including a positive adjustment current $I_{OS+}$ 1110 and/or a negative adjustment current $I_{OS-}$ 1120. In some instances, the range and/or step size of the symmetry adjustment signals may be controlled by the reference current 1025 and/or the scaling applied to the adjustment current.

One or more stored data bits 1060 may be used to configure the positive adjustment current $I_{OS+}$ 1110, such as B1, B2 and B3, and one or more stored data bits 1060 may be used to configure the negative adjustment current $I_{OS-}$ 1120, such as B4, B5, B6. The data bits 1060 may be used to create the adjustment current 1110/1120 as a function of a reference current $Ios_{REF}$ 1025. The data bits B1, B2, B3 may correspond to a multiple applied to the reference current 1025. For example, the reference bits 1060 may represent one or more binary numbers within a range (e.g., from 0 to 7). A least significant bit B1/B4 may correspond with either no adjustment current (e.g., '0') or an adjustment current equivalent to the reference current 1025 (e.g., '1X') using the transistor 1132/1142. Similarly, B2/B5 may correspond to twice the reference current 1025 using the transistor 1134/1144, and B3/B6 may correspond to four times the reference current 1025 using the transistor 1136/1146. By selecting various combinations of B1-B3 and B4-B6, the positive adjustment current $I_{OS+}$ 1110 and/or the negative adjustment current $I_{OS-}$ 1120 may be set.

Figure 12:
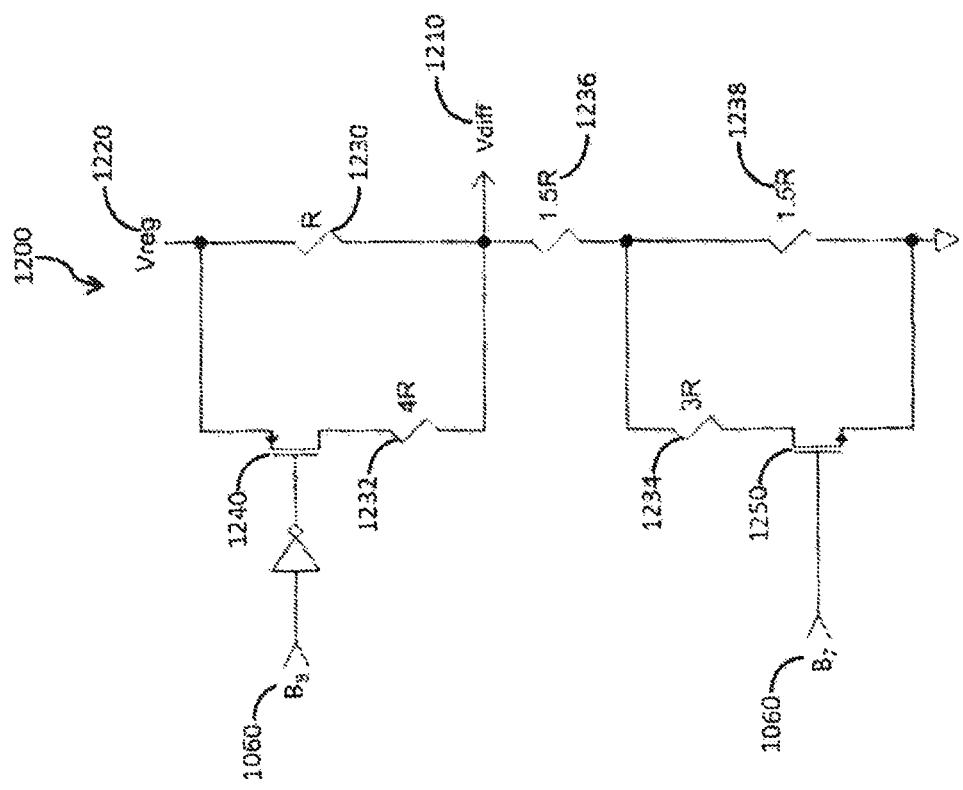
FIG. 12 is a block diagram of an illustrative differential adjustment circuit for adjusting a differential (i.e. hysteresis) of a packaged magnetic field sensor.

FIG. 12 is a block diagram of an illustrative differential (i.e. hysteresis) adjustment circuit 1200 for adjusting a differential of a packaged magnetic field sensor. In some cases, the differential adjustment circuit 1200 may be capable of producing a differential adjustment signal, such as the voltage signal 1210. The differential adjustment circuit 1200 may be configured to control and/or adjust the differential of the packaged magnetic field sensor.

One or more stored data bits 1060 may be used to decrease/increase the differential adjustment signal 1210. In the example shown, the differential adjustment circuit 1200 is configured to provide a differential adjustment signal 1210 from a regulated reference voltage 1220 (e.g. from voltage regulator 120) using B7, B8, one or more resistors 1230, 1232, 1234, 1236, 1238, and the transistors 1240, 1250. A logic "1" stored in B7 activates transistor switch 1250 and puts resistor 1234 in parallel with resistor 1238 which decreases the differential adjustment signal 1210. Conversely, a logic "1" stored in data bit 8 activates transistor switch 1240 and puts resistor 1232 in parallel with resistor 1230 which increases the differential adjustment signal 1210. Adding additional control bits, and/or resistors, and/or transistors may modify the range and/or step size of the adjustment to the differential adjustment signal.

Figure 13:
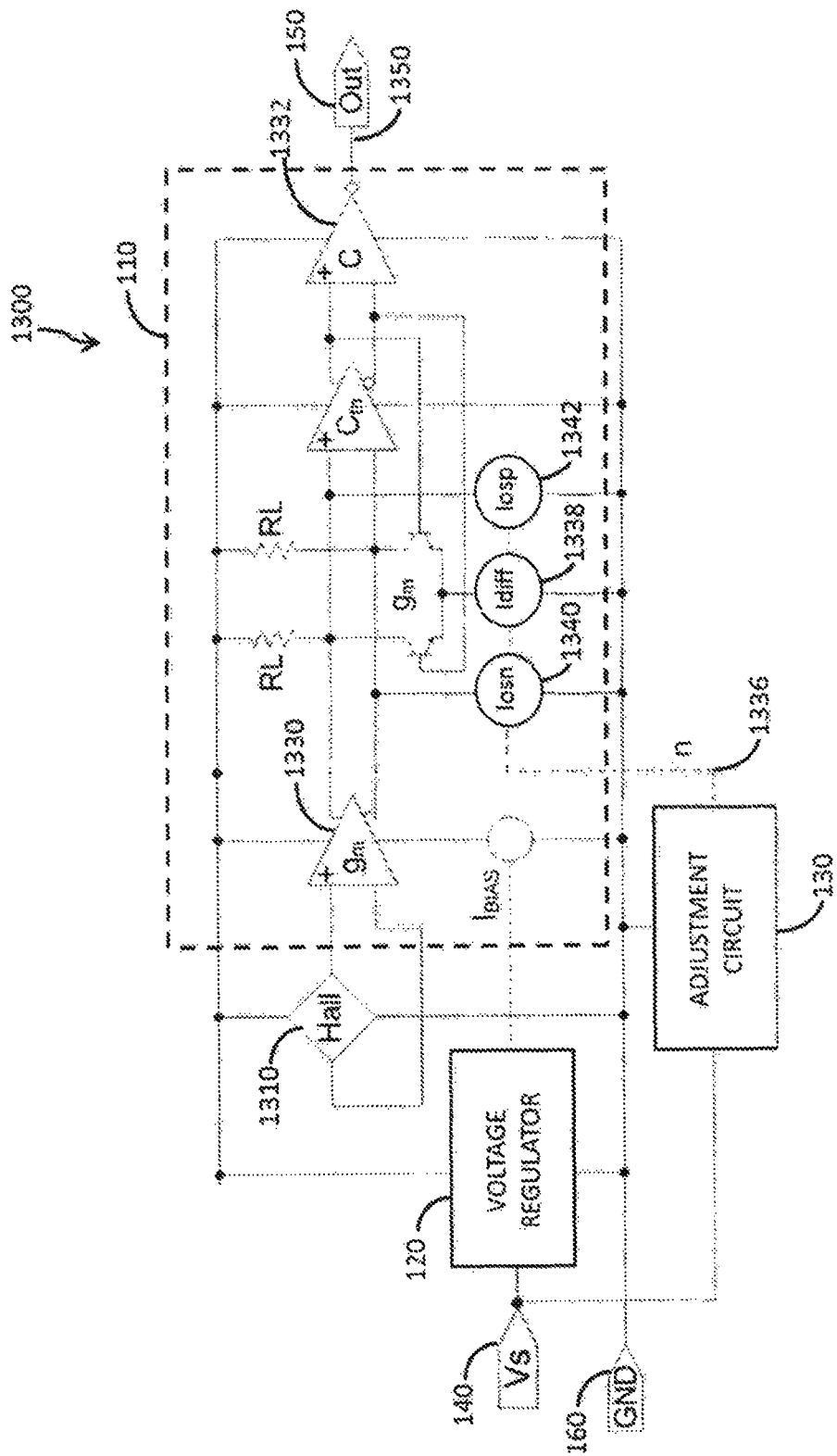
FIG. 13 is a block diagram of an illustrative packaged magnetic field sensor including a magnetic field sensing device, a voltage regulator, a threshold switch circuit and an adjustment circuit.

FIG. 13 is a block diagram of an illustrative packaged magnetic field sensor 1300 including a magnetic field sensing device 1310, a voltage regulator 120, a threshold circuit 110, and an adjustment circuit 130. The illustrative threshold circuit 110 may include a sensing device or may be connected to a sensing device, such as one or more Hall Effect sensors 1310. The sensing circuit 110 may also include one or more amplifiers and/or inverters 1330 and 1332. The sensing circuit 110 may output a sensor output signal on sensor output terminal 150.

In some cases, the sensing circuit 110 may include a hysteresis circuit, such as the hysteresis circuit shown disposed between the amplifiers 1330 and 1332. The hysteresis circuit may include inputs for adjusting the differential and/or the symmetry. In the example shown, the inputs are provided by adjustment circuit 130 via control lines 1336. For example, as noted above, the adjustment circuit 130 may include a differential adjustment circuit 1200 (see FIG. 12), which may provide a differential adjustment signal (Vdiff) 1210. The differential adjustment signal (Vdiff) 1210 may be used to control the current source Idiff 1338 of the threshold circuit 110 of FIG. 13. Likewise, the adjustment circuit 130 may include a symmetry adjustment circuit 1100 (see FIG. 11), which may provide an $I_{OS+}$ 1110 signal and an $I_{OS-}$ 1120 signal. The $I_{OS+}$ 1110 signal and an $I_{OS-}$ 1120 signal may be used to control the current sources Ios+ 1340 and Ios− 1342 of the threshold circuit 110 of FIG. 13. As can be seen from FIGS. 11-13, bits B1-B8 may control both the differential and symmetry of the threshold circuit 110.

Figure 14:
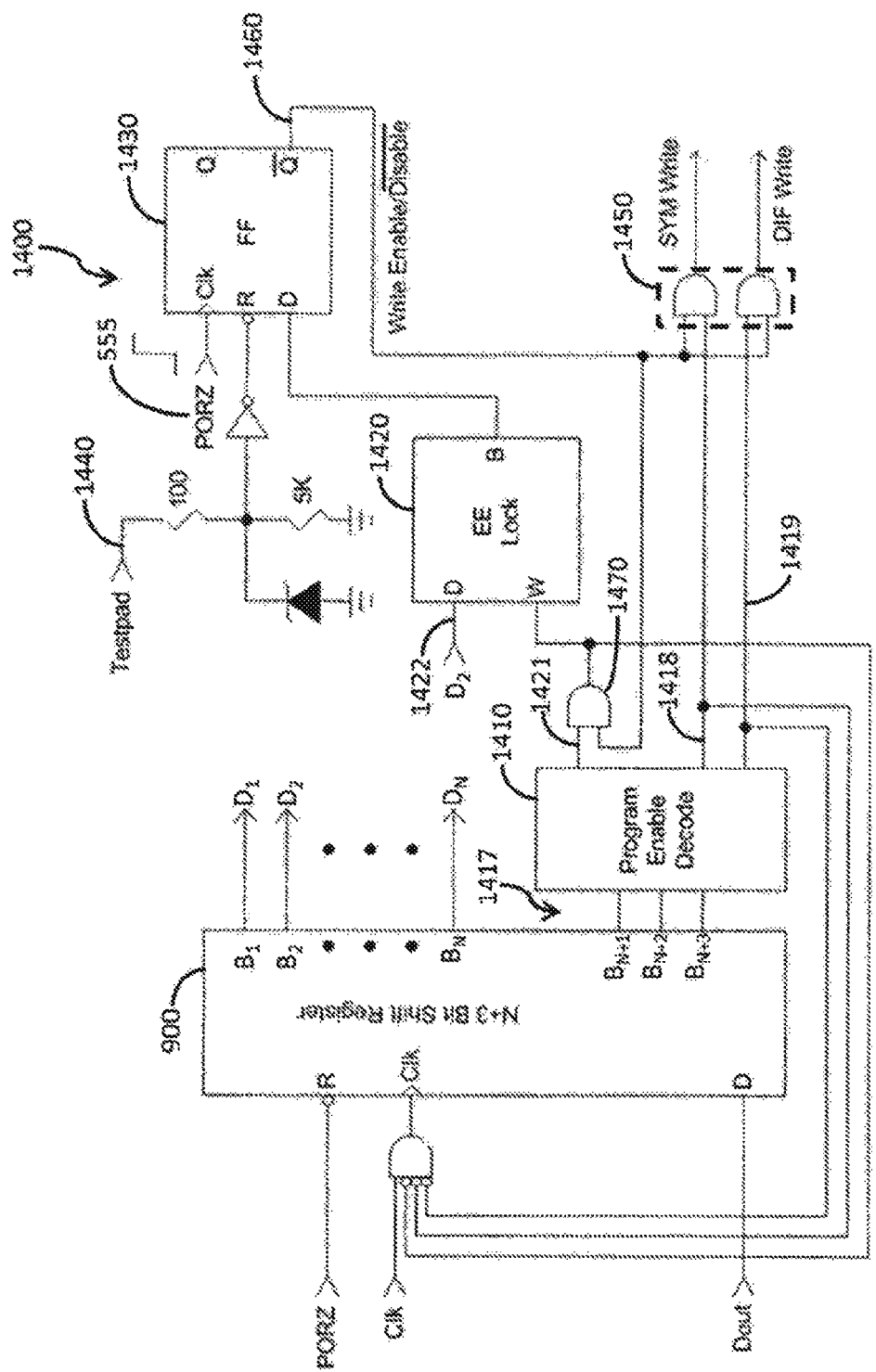
FIG. 14 is a block diagram of the storing circuit of FIG. 2 capable of enabling and/or disabling the storing functionality using a bit sequence received via the power input terminal.

Referring to FIG. 14, it is contemplated that the storing circuit 900 may include one or more lock mechanisms for enabling and/or disabling the ability to write to the memory 240. This ability to disable writing to the memory may be used to help prevent accidental changes to the memory contents (e.g., the differential and symmetry adjustments, etc.). Two such mechanisms may commonly be used, a mechanical mechanism or an electronic mechanism. To disable the ability to write to the memory permanently, the mechanical mechanisms are often used, such as a fuse, an anti-fuse, and/or laser trim components. In one example, a polySi fuse may be used within the circuit such that the fuse may be selectively blown to permanently program the desired parameter setting. An anti-fuse may include diodes that may be selectively shorted. Laser trim components may be used within the circuit and trimmed with a laser, usually prior to packaging. An electronic data lock may be permanent or may be temporary. In some instances, a permanent electronic lock may correspond to loading one or more bits within the non-volatile memory that disable further programming due to other logic circuitry tied to the write enable bits of the memory.

If a permanent electronic lock out of the programming functionality is not desired, other methods may be used, such as high probability write protection. High probability write protection may include using messages with a relatively high bit count, which may decrease the probability of accidental programming of data into the memory. In one example, using fourteen binary bits is approximately the same as using a four-digit decimal PIN. Other methods may be used, such as using a medium bit count in addition to using another write protect bit. By using these methods, the probability that an accidental loss or overwrite of data due to noise and/or other electromagnetic interference may be reduced. In some cases, using one or more of the electronic locking methods, the chances of accidental loss of adjustment information can be reduced to hundreds or tens of parts-per-million (ppm). In some cases, the data loss may be less than 5 ppm.

FIG. 14 is a block diagram of the storing circuit of FIG. 2 capable of enabling or disabling the functionality to write to memory 240 using a bit sequence received via the power input terminal 140. In the example shown, two messages may be used for enabling and/or disabling the writing to memory. For example, a first message may be sent with the data to disable the lock circuit 1400, and a second message may be sent to enable the lock circuit 1400. The lock circuit 1400 may include a decoder 1410, a memory 1420 that is composed of one or more memory cells 1000, and a flip flop 1430 for performing the logic for locking or unlocking the memory writing functionality. In some cases, the output of memory 1420 is loaded into flip flop 1430 when the POR 555 is asserted. In some cases, the output 1460 of flip flop 1430 is a logic "1" which allows the decoded program enable lines (e.g., 1418, 1419, and 1421) to control the write/read states within memory 240 through AND gates 1450, 1470. In some cases, the output 1460 of flip flop 1430 is a logic "0" which disables writing to memory 240.

In some cases, the initial contents of memory 1420 may inadvertently contain the lock code which may be bypassed prior to packaging through a test pad input 1440 that may be configured to receive a pulse from an external source. The input received at the test pad 1440 may be used to reset the flip flop 1430 after POR 555 is asserted to enable the unlock code to be written into memory 1420. In these cases, the probability of accidental data write/loss may be less than five parts-per-million.

Figure 15:
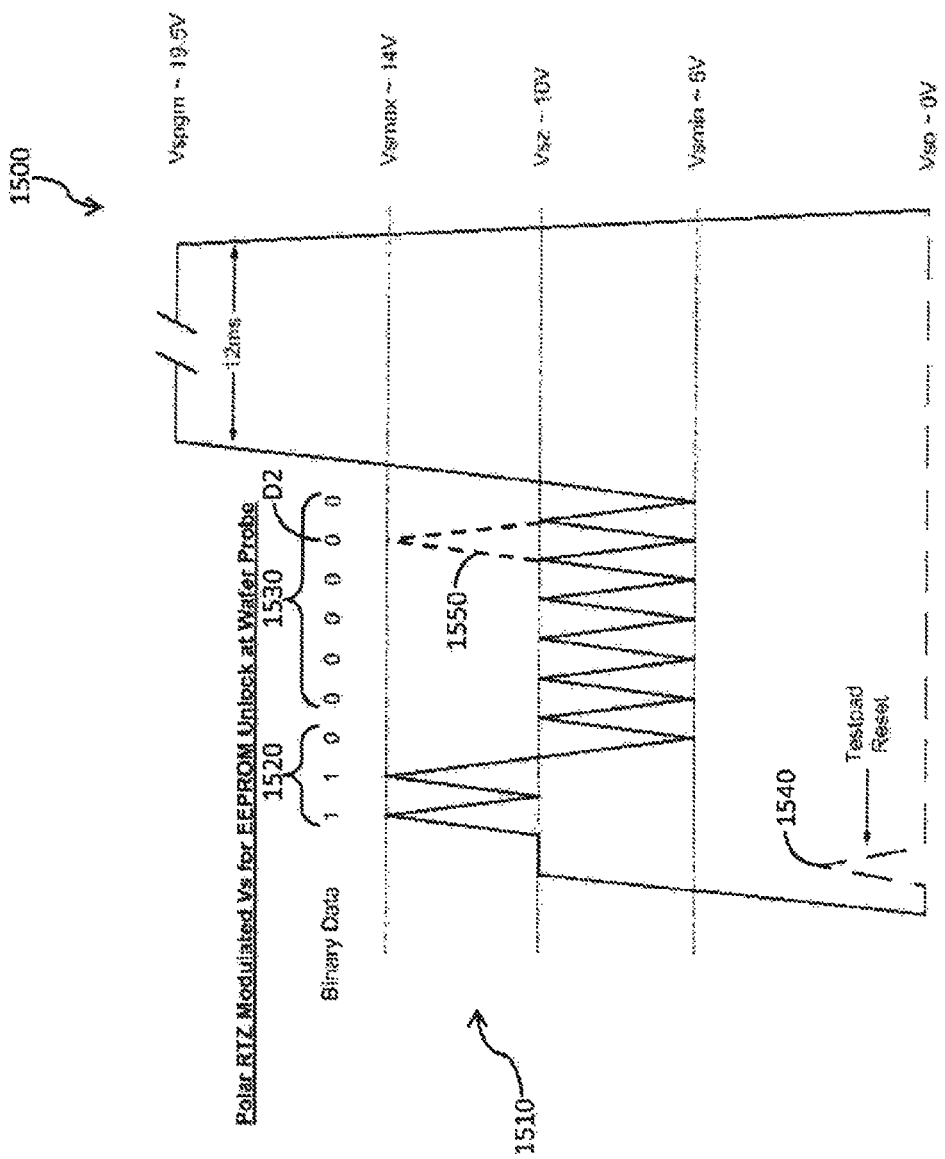
FIG. 15 shows an illustrative waveform to store a parameter adjustment in a memory and enable writing using the storing circuit of FIG. 14.

FIG. 15 shows an illustrative waveform 1500 to store a parameter adjustment in a memory and enable writing using the storing circuit of FIG. 14. A first message may include a three bit parameter field 1520 that decodes to assert program enable line 1421, and a 6 bit data field 1530 containing a logic "0" in bit D2 as the "unlock" code to be written to memory 1420. An additional pulse 1540 may be sent prior to packaging via the test pad 1440 to disable the lock 1400, which enables the writing to memory 240. After all of the sensor adjustment messages have been written into memory 240, then a second message may be sent with a three bit parameter field 1520 that decodes to assert program enable line 1421, and a 6 bit data field 1530 containing a logic "1" in bit D2 (e.g., 1550) to enable the lock 1400.

Figure 16:
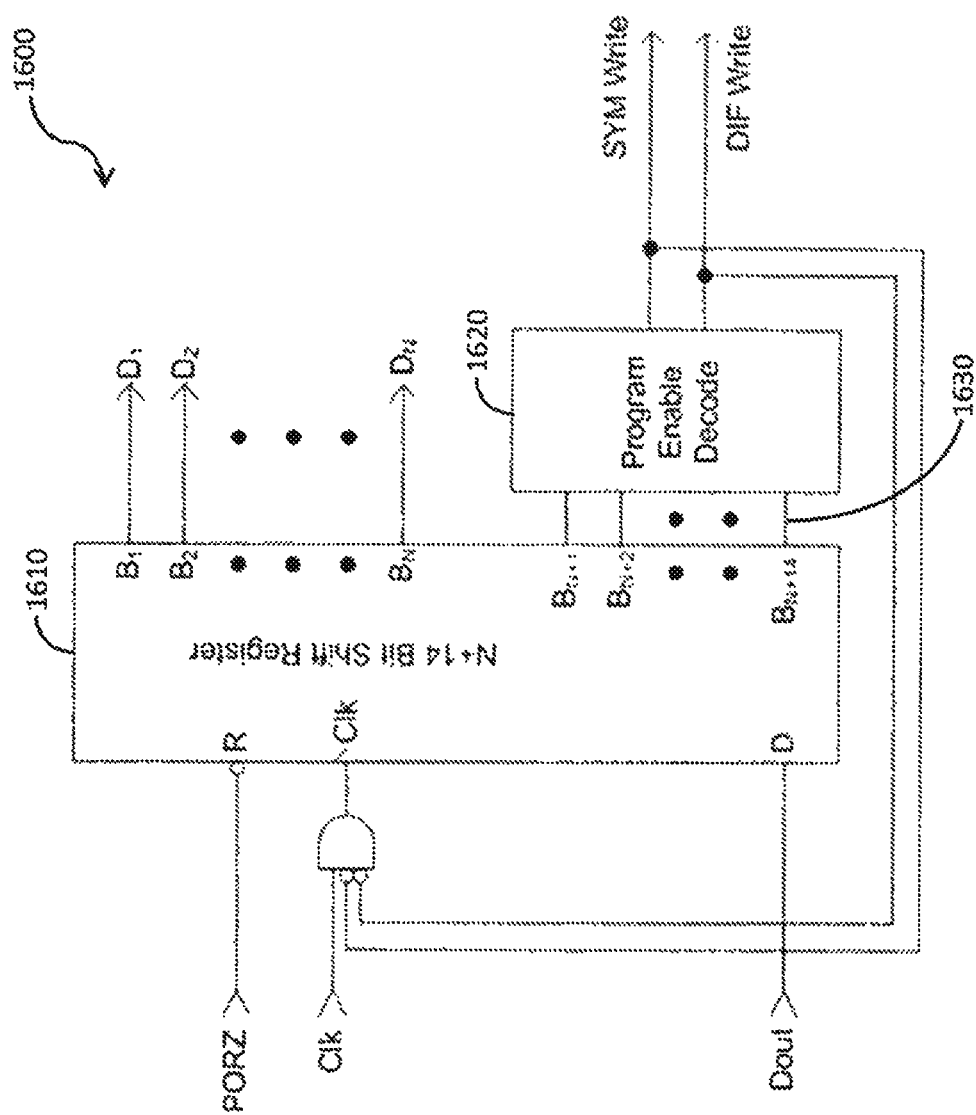
FIG. 16 is a block diagram of the storing circuit of FIG. 2 capable of enabling and/or disabling the storing functionality using an extended bit sequence received via the power input terminal.
Figure 17:
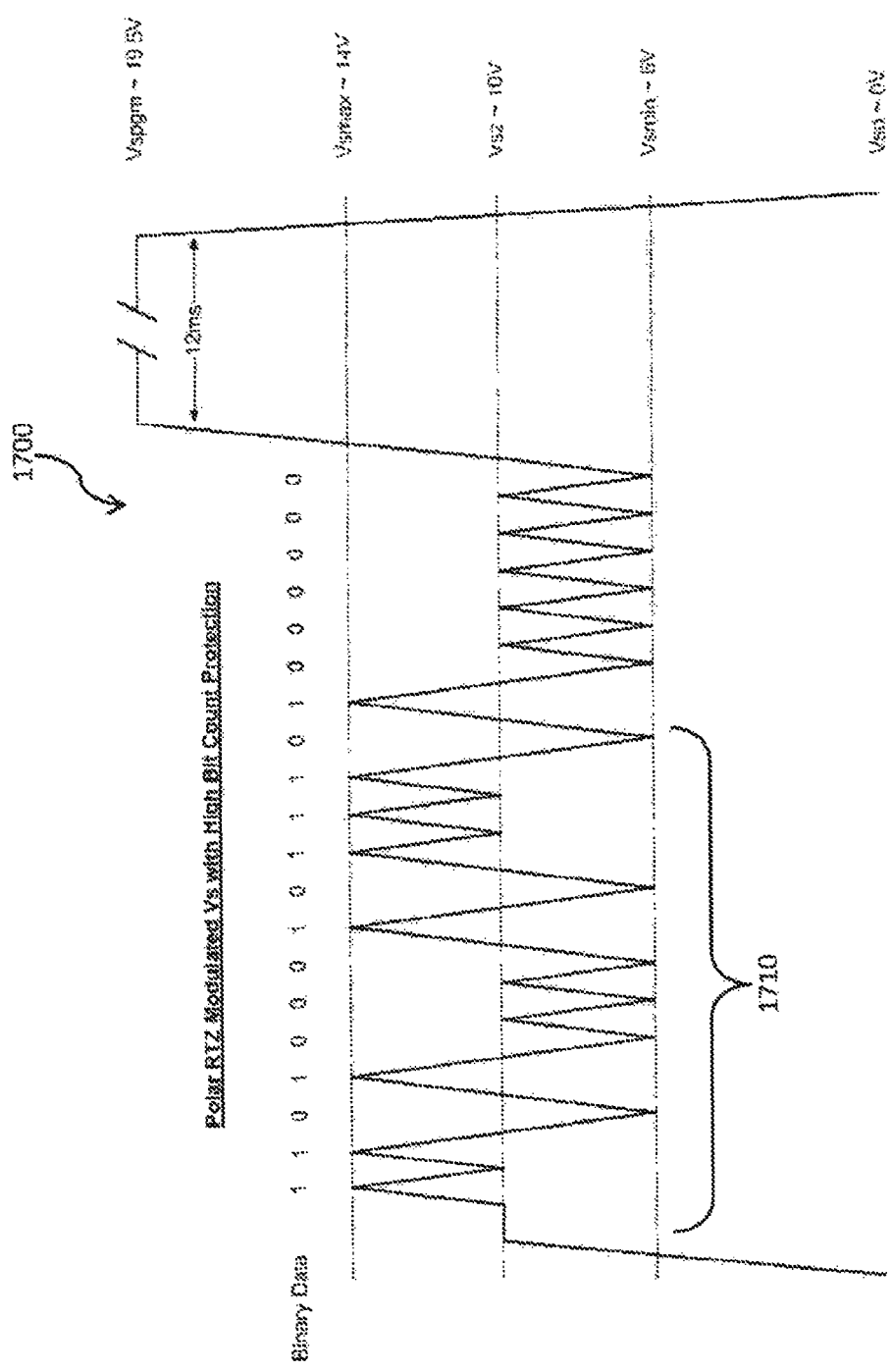
FIG. 17 shows an illustrative waveform to store a parameter adjustment in a memory using the storing circuit of FIG. 16.

FIG. 16 is a block diagram of the storing circuit 230 of FIG. 2 that is capable of protecting the stored adjustment data against accidental loss or overwrite by using an extended bit sequence received via the power input terminal 140. In some cases, the storing circuit 1600 may include a shift register 1610 and a decoder 1620 to decode the bits sent in the messages to determine the type of adjustment to perform. For example, in FIG. 3 the parameter field is shown to include 5 data bits. In other cases, a greater or lesser number of data bits (e.g., 3 bits, 11 bits, 14 bits, etc.) may be used, as desired. The probability of noise and/or other electromagnetic interference causing an accidental write to memory decreases with the number of bits used. For example, by using a five bit parameter field, and using two codes (e.g., a symmetry adjust code and a differential adjust code) of the possible $2^5$ codes, the probability of an accidental write to memory is approximately 6%. However, when using two codes, and a higher bit count, the probability of an accidental write reduces dramatically. For example, when 11 bits are used (e.g., $2^{11}$ possible codes) with the same 2 codes defined, the accidental write rate due to noise reduces to less than 1000 ppm (i.e. less than 0.1%). When 14 bits are used (e.g., $2^{14}$ possible codes) with the same 2 codes defined, the accidental write rate reduces to about 100 ppm (i.e. about 0.01%). FIG. 17 shows an illustrative waveform 1700 having an extended bit sequence for storing a parameter adjustment into memory. In this example, the waveform 1700 has a parameter field 1710 of 14 bits.

Having thus described several illustrative embodiments of the present disclosure, those of skill in the art will readily appreciate that yet other embodiments may be made and used within the scope of the claims hereto attached. It will be understood that this disclosure is, in many respects, only illustrative. Changes may be made in details, particularly in matters of shape, size, and arrangement of parts without exceeding the scope of the disclosure. The disclosure's scope is, of course, defined in the language in which the appended claims are expressed.

What is claimed is:

1. A packaged magnetic field sensor for receiving sensor adjustment messages from an external source, the packaged magnetic field sensor comprising:
    a package housing;
    a magnetic field sensing device situated in the package housing for sensing a magnetic field;
    a power input terminal accessible from outside of the package housing;
    a sensor output terminal accessible from outside of the package housing for providing an output signal that is related to the magnetic field sensed by the magnetic field sensing device;
    a sensing block situated in the package housing and electrically coupled to the magnetic field sensing device and the sensor output terminal; and
    an adjustment block situated in the package housing coupled to the power input terminal and the sensing block, the adjustment block adjusting at least two parameters of the output signal based on one or more sensor adjustment messages that are modulated onto the power input terminal of the packaged magnetic field sensor by the external source.

2. The packaged magnetic field sensor of claim 1, wherein each of the one or more sensor adjustment messages include a parameter field and a data field, wherein the parameter field identifies one of the at least two parameters of the output signal to adjust, and the data field identifies a measure related to an adjusted value for the identified parameter.

3. The packaged magnetic field sensor of claim 2, wherein the parameter field and the data field each include bit-coded information.

4. The packaged magnetic field sensor of claim 3, wherein each of the one or more sensor adjustment messages are provided as a serial bit stream modulated onto the power input terminal of the packaged magnetic field sensor, and the adjustment block includes a decoder for decoding the serial bit stream for each sensor adjustment message into its corresponding parameter field and data field.

5. The packaged magnetic field sensor of claim 2, wherein the adjustment block includes a memory for storing the measure related to the adjusted value for each parameter of the one or more sensor adjustment messages.

6. The packaged magnetic field sensor of claim 5, wherein the memory is a non-volatile memory.

7. The packaged magnetic field sensor of claim 1, wherein the magnetic field sensing device is a Hall effect sensor.

8. The packaged magnetic field sensor of claim 1, wherein the magnetic field sensing device is an anisotropic magnetoresistance meter.

9. The packaged magnetic field sensor of claim 1, wherein the sensing block provides a digital output signal to the sensor output terminal.

10. A packaged magnetic field sensor, comprising:
    a package housing;
    a power input terminal accessible from outside of the package housing;
    a magnetic field sensing device situated in the package housing for sensing a magnetic field;
    a sensor output terminal accessible from outside of the package housing for providing an output signal that is related to the magnetic field sensed by the magnetic field sensing device;
    a sensing block situated in the package housing and electrically coupled to the magnetic field sensing device and the sensor output terminal;
    an adjustment block situated in the package housing and electrically coupled to the power input terminal and the sensing block, the adjustment block adjusting the sensor output signal differently for each of two or more temperature ranges, wherein the adjustment is based on adjustment information transmitted via one or more sensor adjustment messages that are modulated onto the power input terminal of the packaged magnetic field sensor by an external source; and
    a memory situated in the package housing and coupled to the adjustment block, the memory storing a first set of adjustment information used for adjusting the sensor output signal over a first temperature range and a second set of adjustment information for adjusting the sensor output signal over a second temperature range.

11. The packaged magnetic field sensor of claim 10, wherein each of the one or more sensor adjustment messages are provided as a serial bit stream modulated onto the power input terminal of the packaged magnetic field sensor, and the adjustment block includes a decoder for decoding the serial bit stream for each sensor adjustment message.

12. The packaged magnetic field sensor of claim 10, wherein the memory is a non-volatile memory.

13. The packaged magnetic field sensor of claim 10, wherein the magnetic field sensing device is at least one of a Hall effect sensor or an anisotropic magnetoresistance meter.

14. A packaged magnetic field sensor for providing an output corresponding to a sensed magnetic field, the packaged magnetic field senor comprising:
    a package housing including a power input terminal and a sensor output terminal;
    a magnetic field sensing device situated in the package housing for sensing a magnetic field;
    a sensing block situated in the package housing, the sensing block providing an output signal that is related to the sensed magnetic field to the sensor output terminal;
    a voltage regulator situated in the package housing and coupled to the power input terminal, the voltage regulator providing a regulated supply voltage from a supply voltage signal received at the power input terminal to the magnetic field sensing device and the sensing block during operation of the packaged magnetic field sensor;
    an adjustment block coupled to the power input terminal, the voltage regulator and the sensing block, the adjustment block including a communication block that is configured to receive adjustment information via a modulated polar-return-to-zero (RTZ) signal on the supply voltage signal at the power input terminal, the communication block including:
        a memory for storing the received adjustment information;
        a signal conditioning block for scaling the modulated polar-return-to-zero (RTZ) signal;
        a demodulation block coupled to the signal conditioning block, the demodulation block configured to decode the polar return-to-zero signal into a serial modulation envelope signal and a clock signal, the serial modulation envelope signal including the adjustment information; and a storing block coupled to the demodulation block and the memory, the storing block storing the adjustment data included in the serial modulation envelope signal into the memory; and the adjustment block configured to use the adjustment information stored in the memory of the communication block to adjust at least one of a symmetry, sensitivity, differential, offset, temperature compensation, linearity, polarity, operating point, release point, and/or hysteresis of the output signal.

15. The packaged magnetic field sensor of claim 14, wherein the adjustment block re-adjusts the symmetry, sensitivity, differential, offset, temperature compensation, linearity, polarity, operating point, release point, and/or hysteresis of the output signal using adjustment information subsequently received via the communication block.

16. The packaged magnetic field sensor of claim 14, wherein the memory stores two or more sets of adjustment information, wherein a first set of adjustment information is used by the adjustment block to adjust a symmetry of the output signal, and a second set of adjustment information is used to adjust a differential of the output signal.

17. The packaged magnetic field sensor of claim 14, wherein the memory stores temperature adjustment information, wherein the temperature adjustment information includes a first set of adjustment information for use in a first temperature range and a second set of adjustment information for in a second temperature range.

18. The packaged magnetic field sensor of claim 14, further comprising a programming lock coupled to the communication block, wherein the programming lock is configured to receive an input to enable and/or disable storing adjustment information to the memory.

19. The packaged magnetic field sensor of claim 18, wherein the memory includes a volatile memory and/or a non-volatile memory, and wherein the programming lock is configured to receive an input to enable and/or disable storing adjustment information to the memory.

20. The packaged magnetic field sensor of claim 14, wherein the polar return-to-zero signal includes:
a central voltage corresponding to a signal zero;
a signal high voltage greater than the central voltage, wherein a signal pulse from about the central voltage to about the signal high voltage and back to about the central voltage corresponds to a data bit representing a first binary value; and
a signal low voltage, less than the central voltage, wherein a signal pulse from about the central voltage to about the signal low voltage and back to about the central voltage corresponds to a data bit representing a second binary value.

21. The packaged magnetic field sensor of claim 20, wherein the central voltage and the signal low voltage are greater than zero volts, and wherein the difference between the central voltage and the signal high voltage is about equal to the difference between the central voltage and the signal low voltage.

22. The packaged magnetic field sensor of claim 20, wherein the polar return-to-zero signal further includes a programming voltage level greater than the signal high voltage level, wherein a signal pulse at the signal programming voltage level received after a last bit of a serial data signal corresponds to storing adjustment information to the memory, and wherein a power-on-reset signal may be generated using a transition from a voltage below a threshold value to about the central voltage at the beginning of the polar return to zero signal.

23. A magnetic field sensor comprising:
a substrate including a power input terminal and a sensor output terminal;
a magnetic field sensing circuit situated on the substrate and powered by a power signal applied to the power input terminal, the magnetic field sensing circuit configured to sense a magnetic field and generate a sensor output signal on the sensor output terminal;
a non-volatile memory situated on the substrate for storing sensor adjustment information;
an adjustment circuit situated on the substrate and having a communication circuit, the communications circuit coupled to the power input terminal and the non-volatile memory, the communication circuit configured to:
receive a message including sensor adjustment information, the message modulated onto the power input signal;
decode the received sensor adjustment information;
store the decoded adjustment information into the non-volatile memory; and
the adjustment circuit is configured to adjust a symmetry, and/or a differential of the sensor output signal of the magnetic field sensing circuit using the adjustment information stored in the non-volatile memory.

\* \* \* \* \*